United States Patent
Furuya et al.

(10) Patent No.: US 10,236,338 B2
(45) Date of Patent: Mar. 19, 2019

(54) SIC SINGLE CRYSTAL SEED, SIC INGOT, SIC SINGLE CRYSTAL SEED PRODUCTION METHOD, AND SIC SINGLE CRYSTAL INGOT PRODUCTION METHOD

(71) Applicant: SHOWA DENKO K.K., Tokyo (JP)

(72) Inventors: Yuuki Furuya, Sendai (JP); Tomohiro Shonai, Hikone (JP); Yasushi Urakami, Toyoake (JP); Itaru Gunjishima, Nagakute (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/565,439

(22) PCT Filed: Apr. 20, 2016

(86) PCT No.: PCT/JP2016/062511
§ 371 (c)(1),
(2) Date: Oct. 10, 2017

(87) PCT Pub. No.: WO2016/171168
PCT Pub. Date: Oct. 27, 2016

(65) Prior Publication Data
US 2018/0130872 A1    May 10, 2018

(30) Foreign Application Priority Data

Apr. 21, 2015 (JP) .................................. 2015-086810

(51) Int. Cl.
*C30B 29/36* (2006.01)
*C30B 33/00* (2006.01)
(Continued)

(52) U.S. Cl.
CPC .......... *H01L 29/045* (2013.01); *C30B 23/025* (2013.01); *C30B 29/36* (2013.01); *C30B 33/00* (2013.01)

(58) Field of Classification Search
CPC ....... C30B 29/36; C30B 33/00; C30B 23/002; C30B 23/025; C30B 23/02; C30B 19/12;
(Continued)

(56) References Cited

U.S. PATENT DOCUMENTS

2005/0211156 A1* 9/2005 Gunjishima ............ C30B 23/00 117/2
2012/0060751 A1* 3/2012 Urakami ................. C30B 23/00 117/106

(Continued)

FOREIGN PATENT DOCUMENTS

JP  2004-323348 A    11/2004
JP  2010-235390 A  * 10/2010 ............. C30B 29/36
(Continued)

OTHER PUBLICATIONS

Y. Urakami et al., "TSD Reduction by RAF (repeated a-face) Growth Method," Materials Science Forum, 2012, pp. 9-12, vols. 717-720.

(Continued)

*Primary Examiner* — Alexander Oscar Williams
(74) *Attorney, Agent, or Firm* — Sughrue Mion, PLLC

(57) ABSTRACT

A SiC single crystal seed of the present invention has a main surface with an offset angle of at least 2° but not more than 20° relative to the {0001} plane, and at least one sub-growth surface, wherein the sub-growth surface includes an initial facet formation surface that is on the offset upstream side of the main surface and has an inclination angle θ relative to the {0001} plane with an absolute value of less than 2° in any direction, and the initial facet formation surface has a screw dislocation starting point.

19 Claims, 8 Drawing Sheets

(51) Int. Cl.
   *H01L 29/04*   (2006.01)
   *C30B 23/02*   (2006.01)

(58) Field of Classification Search
   CPC ......... C30B 25/20; C30B 9/00; C30B 25/186; H01L 29/045
   USPC ........................................................ 257/628
   See application file for complete search history.

(56) References Cited

U.S. PATENT DOCUMENTS

| | | | | |
|---|---|---|---|---|
| 2012/0132132 | A1* | 5/2012 | Urakami | C30B 23/025 117/106 |
| 2014/0027787 | A1* | 1/2014 | Gunjishima | H01L 29/045 257/77 |
| 2015/0267319 | A1* | 9/2015 | Sato | C30B 29/36 423/345 |
| 2015/0275397 | A1* | 10/2015 | Gunjishima | C30B 29/36 428/64.1 |
| 2015/0308014 | A1* | 10/2015 | Gunjishima | C30B 29/36 423/345 |
| 2015/0349062 | A1* | 12/2015 | Konstantinov | H01L 29/1608 257/77 |
| 2018/0112328 | A1* | 4/2018 | Seki | C30B 29/36 |

FOREIGN PATENT DOCUMENTS

| | | | |
|---|---|---|---|
| JP | 2012-046377 A | 3/2012 | |
| JP | 5171571 B2 | 3/2013 | |
| JP | 2015-048259 A | 3/2015 | |
| JP | 2015-54814 A * | 3/2015 | ............. C30B 29/36 |
| WO | 2014076893 A1 * | 5/2014 | ............. C30B 29/36 |
| WO | 2014077368 A1 * | 5/2014 | ............. C30B 29/36 |

OTHER PUBLICATIONS

International Search Report of PCT/JP2016/062511 dated Aug. 2, 2016

* cited by examiner

SIC SINGLE CRYSTAL SEED, SIC INGOT, SIC SINGLE CRYSTAL SEED PRODUCTION METHOD, AND SIC SINGLE CRYSTAL INGOT PRODUCTION METHOD

CROSS REFERENCE TO RELATED APPLICATIONS

This application is a National Stage of International Application No. PCT/JP2016/062511 filed Apr. 20, 2016, claiming priority based on Japanese Patent Application No. 2015-086810 filed Apr. 21, 2015, the contents of all of which are incorporated herein by reference in their entirety.

TECHNICAL FIELD

The present invention relates to a SiC single crystal seed, a SiC ingot, a SiC single crystal seed production method, and a SiC single crystal ingot production method. Priority is claimed on Japanese Patent Application No. 2015-086810, filed Apr. 21, 2015, the content of which is incorporated herein by reference.

BACKGROUND ART

Silicon carbide (SiC) has a dielectric breakdown electric field that is an order of magnitude larger than that of silicon (Si). Further, compared with silicon (Si), silicon carbide (SiC) also has properties including a band gap that is three times larger, and a thermal conductivity that is about three times higher. As a result, SiC holds considerable promise for applications to power devices, high-frequency devices, and high-temperature operation devices and the like. In recent years, SiC epitaxial wafers are increasingly being used for the above types of semiconductor devices.

SiC epitaxial wafers are produced using SiC single crystal wafers processed from SiC ingots as the substrates for forming SiC epitaxial films. A SiC epitaxial wafer is typically produced by growing a SiC epitaxial film that functions as the active region of a SiC semiconductor device on a SiC single crystal wafer using a chemical vapor deposition (CVD) method.

Further, SiC ingots are obtained by growing SiC single crystal seeds. High-quality SiC ingots having small amounts of defects and different polytypes are desirable, and therefore the SiC single crystal seed used as the growth starting point for the SiC ingot is preferably a single crystal seed for which the levels of defects and different polytypes can be controlled.

In the past, dislocations such as threading screw dislocations, threading edge dislocations and basal plane dislocations tended to exist in SiC single crystal wafers in countless numbers of at least $10^4/cm^2$, and eliminating micropipes that became killer defects was a major problem.

However, as a result of recent improvements in technology, wafers having substantially no micropipes and having not more than $10^4$ dislocations/$cm^2$ are now able to be produced. Particularly in the case of screw dislocations, it has been reported (Non-Patent Document 1) that by performing crystal growth using a seed produced using a method such as the repeated a-face (RAF) method, the number of screw dislocations in the wafer can be reduced to not more than $10/cm^2$. However, another problem arises in that if the screw dislocation density is extremely small, then different polytypes tend to occur.

Generally, the crystal structure of SiC has polytypes including 3C—SiC, 4H—SiC, and 6H—SiC and the like. When viewed from the c-face direction (the <0001> direction), the outermost surface structures of these polytypes are no different. Accordingly, when crystal growth is performed in the c-face direction, the crystal structure can easily change to a different polymorph. In contrast, when these polytypes are viewed from the a-face direction (the <11-20> direction), the outermost surface structures of the crystal structures have differences. Accordingly, in the case of crystal growth in the a-face direction, these polymorphic differences in crystal structure can be inherited. In other words, different polytypes are unlikely to occur.

On the other hand, even in the case of c-face growth, by performing step-flow growth on a growth surface slightly offset from the c-face, the crystal structure can be preserved (and the polymorph differences can be inherited). However, even in those cases where step-flow growth is performed, a-face parallel to the c-face (a c-face facet) is necessarily exposed on the growth surface. This plane that is parallel to the c-face has different growth behavior, and forms a facet growth region. At the stage where the facet growth region is formed, if a screw dislocation exists within the c-face facet, then polymorphic differences in the crystal structure can be inherited during the crystal growth process. In the case of screw growth from a screw dislocation starting point, because the screw portion forms a step, growth in the a-face direction becomes possible, and polymorphic differences in the crystal structure can be inherited. In contrast, when no screw dislocation exists within the facet, then island growth occurs, and polymorphic differences in the crystal structure cannot be inherited. As a result, different polytypes tend to develop within the single crystal. In other words, in order to maintain the polymorphic differences, the facet requires a screw dislocation, and therefore a technique for introducing screw dislocations into a facet is required.

For example, Patent Document 1 discloses a production method for a silicon carbide single crystal that involves growing SiC on a dislocation-controlling seed crystal having a growth surface with an offset angle of not more than 60 degrees from the {0001} plane, and having a screw dislocation formable region on the growth surface.

By growing SiC on the dislocation-controlling seed crystal having a screw dislocation formable region described in Patent Document 1, screw dislocations can be formed reliably within the c-face facet, meaning the occurrence of different polytypes and different orientation crystals can be suppressed.

Further, Patent Document 2 discloses that by ensuring that the growth end face of the seed crystal has a convex shape with a prescribed curvature, a c-face facet region is formed that enables spiral growth during the growth process.

PRIOR ART LITERATURE

Patent Documents

Patent Document 1: Japanese Unexamined Patent Application, First Publication No. 2004-323348
Patent Document 2: Japanese Patent (Granted) Publication No. 5171571

Non-Patent Document

Non-Patent Document 1: Yasushi Urakami et al., Materials Science Forum (2012), 717 to 720, 9

SUMMARY OF THE INVENTION

Problems to be Solved by the Invention

However, when crystal growth is performed on seeds having extremely low screw dislocation densities, such as RAF seeds or seeds formed from ingots grown from RAF seeds, the conventional method disclosed in Patent Document 1 has been unable to adequately suppress the occurrence of different polytypes. It is thought that the method disclosed in Patent Document 1 is unable to reliably introduce screw dislocations into the facet from the initial stage of crystal growth, and aims to minimize the surface area of facets capable of generating different polytypes (namely, points or lines). As a result, the occurrence of different polytypes is prevented by minimizing the surface area of regions for which there is possibility of the development of a different polymorph during the initial stage of crystal growth. When the method disclosed in Patent Document 1 is used, facets gradually expand together with the crystal growth, and if different polytypes do not occur on the facet plane in the period prior to the introduction of a screw dislocation into the facet, then single crystal growth with no different polytypes can be achieved. However, in the method disclosed in Patent Document 1, the occurrence of different polytypes in the very initial stage of crystal growth is a definite probability that is unavoidable. One possible countermeasure is a method in which an extremely high density (at least several thousand/cm$^2$) of screw dislocations is introduced into the facet portion. By using this method, screw dislocations can be introduced into the c-face facet from the initial stage of growth, meaning the probability of the occurrence of different polytypes can be reduced. However, in this case, the dislocations flow in an offset downstream direction, causing the generation of multiple defects in the SiC single crystal. Further, concentration of these defects increases the chance of cracks developing in the SiC single crystal.

Further, Patent Document 1 also discloses a method in which, by subjecting the surface of the seed crystal to an artificial surface treatment, a screw dislocation formable region is formed on the surface of the seed crystal, enabling suppression of the production of different polytypes and different orientation crystals. However, if a screw dislocation formable region is formed on a seed crystal surface that is inclined relative to the {0001} plane, then the location for formation of the c-face facet is not stable. Further, a portion of the screw dislocations are converted to stacking faults or the like, causing a problem wherein the dislocations flow to the offset downstream side.

Furthermore, paragraph 0046 in Patent Document 1 discloses that by forming one or more corner portions in substantially the central portion of the direction perpendicular to both the <0001> direction of the dislocation-controlling seed crystal and the offset direction, a c-face facet is generated near the corners of the dislocation-controlling seed crystal.

However, when a c-face facet is produced near a corner, the c-face facet at the initial stage of growth is essentially a point, and is extremely small. As a result, sufficient screw dislocations cannot be introduced into this extremely small point-like c-face facet, and the occurrence of different polytypes cannot be adequately suppressed. Further, even if screw dislocations were able to be introduced in high density, it is thought that outflow of the dislocations in the offset downstream direction will tend to cause multiple defects.

Further, Patent Document 2 discloses that by ensuring that the growth end face of the seed crystal has a convex shape with a prescribed curvature, a c-face facet region can be formed that enables spiral growth during the growth process.

The point where the convex facing surface is parallel with the {0001} plane becomes a c-face facet in the growth process, and the crystal growth in that plane becomes spiral growth, thus suppressing the occurrence of different polytypes and the like.

However, in this method, the point parallel with the {0001} plane changes depending on the crystal growth state, resulting in a corresponding change in the location of the spiral growth. As a result, the facet position, size, shape and surface state and the like cannot be set as desired.

As described above, a SiC single crystal seed and a production method for a SiC single crystal seed are required that are able to suppress the occurrence of different polytypes, and also suppress the outflow of crystal dislocations and the occurrence of crystal defects that typically accompany the introduction of a high density of screw dislocations, thereby enabling control of the facet position. Further, a SiC ingot, and a SiC single crystal wafer that are able to suppress the occurrence of different polytypes, and also suppress the outflow of crystal dislocations and the occurrence of crystal defects that typically accompany the introduction of a high density of screw dislocations, thereby controlling the facet position, are also eagerly sought.

The present invention has been developed in light of the above issues, and has an object of providing a SiC single crystal seed and a production method for a SiC single crystal seed that are able to reliably prevent the occurrence of different polytypes in the initial stage of crystal growth, while suppressing the outflow of crystal dislocations and the occurrence of crystal defects that typically accompany the introduction of a high density of screw dislocations, thus enabling control of the facet position. Further, the present invention also has an object of providing a SiC ingot, and a SiC single crystal wafer that are able to suppress the occurrence of different polytypes, and also suppress the outflow of crystal dislocations and the occurrence of crystal defects that typically accompany the introduction of a high density of screw dislocations, thereby controlling the facet position.

Means for Solving the Problems

The inventors of the present invention investigated SiC single crystal seeds that were able to suppress the occurrence of different polytypes, while suppressing the outflow of crystal dislocations and the occurrence of crystal defects that accompany the introduction of a high density of screw dislocations. As a result, they discovered that in a SiC single crystal seed having an initial facet formation surface that is on the offset upstream side of the main surface and has an inclination angle θ relative to the {0001} plane with an absolute value of less than 2° in any direction, by providing a screw dislocation starting point on the initial facet formation surface having the prescribed region, a suppression effect on the occurrence of different polytypes due to screw dislocations, and a suppression effect on the outflow of crystal dislocations and the occurrence of crystal defects caused by an overly high density of screw dislocations were able to be realized simultaneously, and they were thus able to complete the present invention.

In other words, in order to achieve the objects described above, the present invention provides the following aspects.

(1) A SiC single crystal seed according to one aspect of the present invention has a main surface having an offset angle of at least 2° but not more than 20° relative to the {0001} plane, and at least one sub-growth surface, wherein the sub-growth surface includes an initial facet formation surface that is on the offset upstream side of the main surface and has an inclination angle θ relative to the {0001} plane with an absolute value of less than 2° in any direction, and the initial facet formation surface has a screw dislocation starting point.

(2) In the SiC single crystal seed according to (1) above, the initial facet formation surface may be a top surface formed by cutting an apex formed by the main surface and at least two sub-growth surfaces.

(3) In the SiC single crystal seed according to (1) or (2) above, the effective screw dislocation starting point density of the initial facet formation surface is at least 16/cm$^2$ but not more than 1,000/cm$^2$.

(4) In the SiC single crystal seed according to any one of (1) to (3) above, the screw dislocation starting point of the initial facet formation surface may be a screw dislocation.

(5) In the SiC single crystal seed according to any one of (1) to (4) above, the screw dislocation density of the initial facet formation surface may be at least 16/cm$^2$ but not more than 1,000/cm$^2$.

(6) In the SiC single crystal seed according to any one of (1) to (5) above, the screw dislocation density of a surface positioned offset downstream from the initial facet formation surface is not more than 15/cm$^2$.

(7) In the SiC single crystal seed according to any one of (1) to (6) above, the number of the sub-growth surfaces, including the initial facet formation surface, may be at least three, and each edge of the initial facet formation surface may have a common edge with the main surface or a sub-growth surface.

(8) In the SiC single crystal seed according to any one of (1) to (7) above, the surface area of the initial facet formation surface may be at least 1.0 mm$^2$.

(9) In the SiC single crystal seed according to any one of (1) to (8) above, if the effective screw dislocation starting point density of the initial facet formation surface is termed d (/cm$^2$), then the surface area A (cm$^2$) of the initial facet formation surface may satisfy $0.5 \leq 1-(1-A)^{d-1}(1-A+dA)$.

(10) In the SiC single crystal seed according to any one of (1) to (9) above, the maximum diameter $D_{F1}$ of a circumscribed circle and the maximum diameter $D_{F2}$ of an inscribed circle of the initial facet formation surface may satisfy a relationship represented by $D_{F1}/D_{F2}<4$.

(11) In the SiC single crystal seed according to any one of (1) to (10) above, at least one edge where the main surface contacts the initial facet formation surface may be substantially perpendicular to the offset direction.

(12) In the SiC single crystal seed according to any one of (1) to (11) above, if the diameter of a circumscribed circle of the single crystal seed is termed $D_S$, then the initial facet formation surface may exist in a position that is separated from the center of the overall single crystal seed by at least $D_S/4$.

(13) In the SiC single crystal seed according to any one of (1) to (12) above, the initial facet formation surface preferably does not have a damage layer at the surface.

(14) In the SiC single crystal seed according to any one of (1) to (13) above, the initial facet formation surface may have a step.

(15) A SiC ingot according to one aspect of the present invention is a SiC ingot grown from the SiC single crystal seed according to any one of (1) to (14) above, wherein the SiC ingot has a facet growth region across the entire region in the SiC growth direction from the facet formation surface of the SiC single crystal seed.

(16) In the SiC ingot according to (15) above, if the effective screw dislocation starting point density of the initial facet formation surface is termed d (/cm$^2$), then the surface area $A_f$ (cm$^2$) of a cut surface obtained by cutting the facet growth region through a surface orthogonal to the growth direction may satisfy $0.5 \leq 1-(1-A_f)^{d-1}(1-A_f+dA_f)$.

(17) In the SiC ingot according to (15) or (16) above, the screw dislocation density of the cut surface may be at least 16/cm$^2$ but not more than 1,000/cm$^2$.

(18) In the SiC ingot according to any one of (15) to (17) above, when viewed in plan view from a direction orthogonal to a c-face facet, the initial facet formation surface of the SiC single crystal seed and the c-face facet of the outermost surface of the facet growth region overlap at least partially.

(19) In the SiC ingot according to any one of (15) to (18) above, the facet growth region may be on the offset upstream side of the center of the SiC ingot.

(20) A production method for a SiC single crystal seed according to one aspect of the present invention is a production method for a single crystal seed in which an initial facet formation surface includes a screw dislocation starting point, the method having a step of cutting a portion of a SiC single crystal, and forming a main surface having an offset angle of at least 2° but not more than 20° relative to the {0001} plane, and at least one sub-growth surface including an initial facet formation surface that is on the offset upstream side of the main surface and has an inclination angle θ relative to the {0001} plane with an absolute value of less than 2° in any direction.

(21) In the production method for a SiC single crystal seed according to (20) above, a chemical treatment may be performed after the above step of forming the screw dislocation starting point.

(22) In the production method for a SiC single crystal seed according to (20) or (21) above, the surface area A (cm$^2$) of the facet formation surface may be set so as to satisfy $X=1-(1-A)^{d-1}(1-A+dA)>0$, wherein X is the probability that at least two screw dislocations are included in the initial facet formation surface, and d represents the effective screw dislocation starting point density of the initial facet formation surface.

(23) In the production method for a SiC single crystal seed according to (22) above, the surface area A may be determined so that the probability X that at least two screw dislocations are included is 0.5 or higher.

(24) A production method for a SiC ingot according to one aspect of the present invention uses the SiC single crystal seed according to any one of (1) to (14) above.

(25) In the production method for a SiC ingot according to (24) above, in the facet growth region in which the SiC single crystal seed undergoes crystal growth in the <0001> direction from the initial facet formation surface, crystal growth is performed so that the isotherm during the growth stage has an inclination angle δ relative to a surface parallel with the initial facet formation surface with an absolute value of less than 2° in any direction.

Effects of the Invention

The SiC single crystal seed according to one aspect of the present invention has a main surface having an offset angle of at least 2° but not more than 20° relative to the {0001} plane, and at least one sub-growth surface, wherein the sub-growth surface includes an initial facet formation surface that is on the offset upstream side of the main surface and has an inclination angle θ relative to the {0001} plane with an absolute value of less than 2° in any direction, and the initial facet formation surface has a screw dislocation starting point.

Ensuring that the inclination angle θ of the initial facet formation surface relative to the {0001} plane has an absolute value of less than 2° in any direction means that, in the growth stage of the SiC single crystal, the c-face facet is formed in the vicinity of the plane during the initial stage of growth, in a state having at least a certain surface area. Further, the initial facet formation surface is positioned on the offset upstream side of the SiC single crystal seed, and has a screw dislocation starting point within the prescribed region that constitutes the initial facet formation surface. As a result, a plurality of screw dislocations is formed in the c-face facet that is formed immediately upon growth of the SiC single crystal seed on the offset upstream side, but the screw dislocation density does not become too high. Accordingly, the occurrence of crystal defects that typically accompany crystal dislocation outflow and the occurrence of different polytypes can be suppressed. Further, the screw dislocation starting point is preferably a screw dislocation. Screw dislocation starting points include not only screw dislocations themselves, but also other distortions and the like that can generate a screw dislocation. However, the suppression effect on different polytypes and the like is not obtainable until after the distortion or the like has generated a screw dislocation. Consequently, if the screw dislocation starting point is an actual screw dislocation within the SiC single crystal seed itself, then the suppression effect on different polytypes and the like can be enhanced.

In the SiC single crystal seed according one aspect of the present invention, the initial facet formation surface may be a top surface formed by cutting an apex formed by the main surface and at least two sub-growth surfaces. A top surface formed by cutting an apex formed by three or more surfaces is a shape similar to the top surface of a plateau, and therefore the proportion that the initial facet formation surface occupies in the SiC single crystal seed can be reduced. As a result, the surface area of the region having a screw dislocation starting point within the overall SiC single crystal seed can be suppressed to a value within a prescribed range, enabling the screw dislocations generated during growth to be restricted within a prescribed range. This means a high-quality SiC ingot and SiC wafers can be obtained.

In the SiC single crystal seed according to one aspect of the present invention, the effective screw dislocation starting point density of the initial facet formation surface is preferably at least 16/cm$^2$ but not more than 1,000/cm$^2$. By ensuring that the screw dislocation starting point density of the initial facet formation surface falls within this range, the generation of different polytypes can be further suppressed.

In the SiC single crystal seed according to one aspect of the present invention, the number of the sub-growth surfaces, including the initial facet formation surface, is preferably at least three, and each edge of the initial facet formation surface preferably has a common edge with the main surface or a sub-growth surface. If each edge of the initial facet formation surface preferably has a common edge with the main surface or a sub-growth surface, then the region in which the initial facet formation surface can be formed in the SiC single crystal seed is inevitably restricted, and the surface area of the initial facet formation surface can be prevented from becoming excessively large.

In the SiC single crystal seed according to one aspect of the present invention, the surface area of the initial facet formation surface is preferably at least 1 mm$^2$. Further, if the effective screw dislocation starting point density of the initial facet formation surface is termed d (/cm$^2$), then the surface area A (cm$^2$) of the initial facet formation surface preferably satisfies $0.5 \leq 1-(1-A)^{d-1}(1-A+dA)$. If the surface area of the initial facet formation surface is large, then screw dislocations can be more easily introduced from the initial stage into the facet formed immediately on the initial facet formation surface, thereby better reducing the occurrence of different polytypes and the like.

Furthermore, by ensuring that $D_{F1}/D_{F2}<4$, the distance between screw dislocations can be prevented from becoming overly large, and therefore the occurrence of different polytypes can be effectively suppressed from a small number of screw dislocation starting points.

In the SiC single crystal seed according to one aspect of the present invention, it is preferable that at least one edge where the main surface contacts the initial facet formation surface is substantially perpendicular to the offset direction. If at least one edge that forms the initial facet formation surface is substantially perpendicular to the offset direction, then the growth of the initial facet formation surface can be stabilized.

In the SiC single crystal seed according to one aspect of the present invention, the screw dislocation density of a surface positioned offset downstream from the initial facet formation surface is preferably not more than 15/cm$^2$. By ensuring that the screw dislocation density of a surface positioned offset downstream from the initial facet formation surface is not more than this range, a high-quality SiC ingot and SiC wafers with fewer defects can be obtained.

In the SiC single crystal seed according to one aspect of the present invention, if the diameter of a circumscribed circle of the single crystal seed is termed $D_S$, then the initial facet formation surface may exist in a position that is separated from the center of the overall single crystal seed by at least $D_S/4$. By setting the position of the initial facet formation surface in the single crystal seed within this range, the position of the facet growth region during growth is restricted to a position near the outer periphery. In other words, portions having a large number of defects can be more easily excluded, meaning a high-quality SiC ingot and SiC wafers with fewer defects can be obtained.

In the SiC single crystal seed according to one aspect of the present invention, the initial facet formation surface preferably does not have a damage layer at the surface. In some cases, a damage layer may be converted to a screw dislocation or another defect. Accordingly, by ensuring there is no damage layer at the surface, any increase in the density of screw dislocations or occurrence of other defects within the c-face facet immediately following growth can be suppressed. Further, the initial facet formation surface may have an atomic-level step. If the initial facet formation surface has an atomic-level step, then the crystal growth becomes step-flow growth from the initial stage of growth, enabling better suppression of the occurrence of different polytypes.

The SiC ingot according to one aspect of the present invention is a SiC ingot grown from the SiC single crystal seed described above, and has a facet growth region across the entire region in the direction of SiC growth from the facet formation surface of the SiC single crystal seed. This SiC ingot has a facet growth region formed by crystal growth in the <0001> direction, and if the effective screw dislocation starting point density of the initial facet formation surface is termed d (/cm$^2$), then the surface area $A_f$ (cm$^2$)

of a cut surface obtained by cutting this facet growth region through a surface orthogonal to the growth direction preferably satisfies $0.5 \leq 1-(1-A_f)^{d-1}(1-A_f+dA_f)$. Further, the screw dislocation density of this cut surface is preferably at least 16/cm$^2$ but not more than 1,000/cm$^2$. Because the SiC ingot is obtained using the SiC single crystal seed described above, the obtained SiC ingot is of high quality, and the performance of a semiconductor device produced using this SiC ingot can be improved. Furthermore, provided the surface area and screw dislocation density of the facet growth region fall within the above ranges, the occurrence of different polytypes during the crystal growth process can be satisfactorily suppressed, resulting in a higher quality SiC ingot.

In this SiC ingot, when viewed in plan view from a direction orthogonal to a c-face facet, the initial facet formation surface of the SiC single crystal seed and the c-face facet of the outermost surface of the facet growth region preferably overlap at least partially. Further, the facet growth region is preferably on the offset upstream side of the center of the SiC ingot. By ensuring this type of configuration, the facet growth region is limited to the offset upstream end, and therefore the area ratio of the high-quality region in the SiC ingot can be increased.

The production method for a SiC single crystal seed according to one aspect of the present invention is a production method for a single crystal seed in which the initial facet formation surface includes a screw dislocation starting point, the method having a step of cutting a portion of a SiC single crystal, and forming a main surface having an offset angle of at least 20 but not more than 200 relative to the {0001} plane, and at least one sub-growth surface including an initial facet formation surface that is on the offset upstream side of the main surface and has an inclination angle θ relative to the {0001} plane with an absolute value of less than 2° in any direction.

By ensuring that the inclination angle θ of the initial facet formation surface relative to the {0001} plane has an absolute value of less than 2° in any direction, in the growth stage of the SiC single crystal, the c-face facet can be formed in the vicinity of the plane during the initial stage of growth, in a state having at least a certain surface area. Further, by ensuring that the initial facet formation surface has a screw dislocation starting point, the screw dislocations formed immediately after growth exist on the offset upstream side, and the occurrence of different polytypes can be suppressed. Further, because the screw dislocation starting point exists within a region having a prescribed surface area, the density of the screw dislocations formed immediately upon growth can be prevented from becoming too high, and the occurrence of crystal defects that typically accompany the outflow of crystal dislocations and the generation of different polytypes can be suppressed.

Moreover, by performing a chemical treatment after the step of forming the screw dislocation starting point, an atomic-level step can be formed on the initial facet formation surface. As a result, step-flow growth can be performed from the initial stage of growth, enabling better suppression of the occurrence of different polytypes.

In the production method for a SiC single crystal seed according to one aspect of the present invention, if the effective screw dislocation starting point density of the initial facet formation surface is termed d (/cm$^2$), and the surface area of the initial facet formation surface is termed A (cm$^2$), then the surface area A is preferably set so that the probability X that at least two screw dislocations are included in the initial facet formation surface, represented by $X=1-(1-A)^{d-1}(1-A+dA)$, is greater than 0, and more preferably satisfies $X \geq 0.5$. By ensuring that the surface area of the initial facet formation surface satisfies this range, a plurality of screw dislocations can be introduced into the initial facet formation surface with a high probability, enabling better suppression of the occurrence of different polytypes.

The production method for a SiC ingot according to one aspect of the present invention uses the SiC single crystal seed described above. As a result, the positions of screw dislocations generated during growth can be restricted within a prescribed range, enabling production of a high-quality SiC ingot.

Further, in the facet growth region in which the SiC single crystal seed undergoes crystal growth in the <0001> direction from the initial facet formation surface, crystal growth may be performed so that the isotherm during the growth stage has an inclination angle δ relative to a surface parallel with the initial facet formation surface with an absolute value of less than 2° in any direction.

By producing the SiC ingot under this condition, the facet growth region during growth is restricted to a position near the outer periphery. In other words, a high-quality SiC ingot with fewer defects can be obtained.

EMBODIMENTS FOR CARRYING OUT THE INVENTION

A SiC single crystal seed, a SiC ingot, a production method for a SiC single crystal seed and a production method for a SiC ingot according to the present invention are described below in detail with reference to the drawings.

The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the scope of the present invention.

[SiC Single Crystal Seed]

Figure 1:
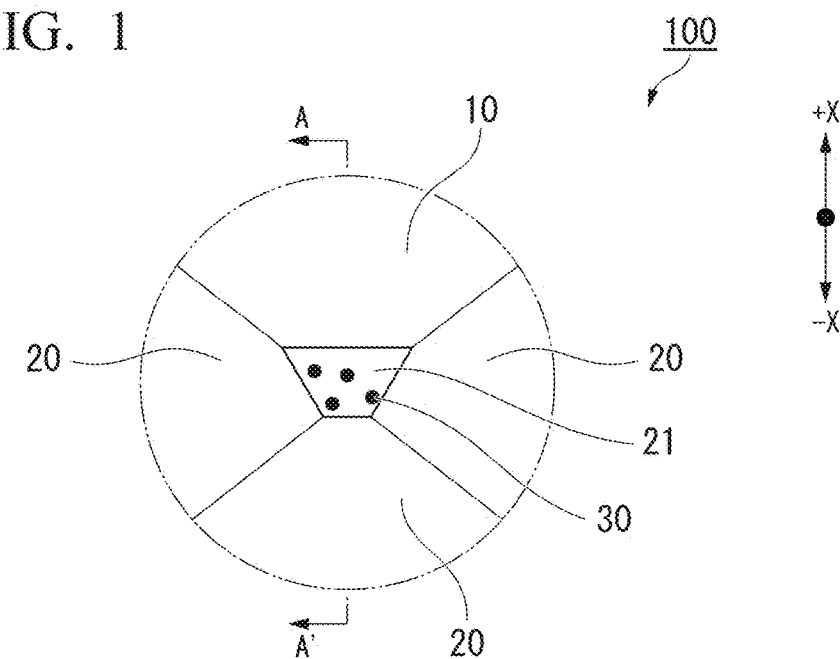
FIG. 1 is schematic plan view of a portion of a SiC single crystal seed according to one aspect of the present invention.
Figure 2:
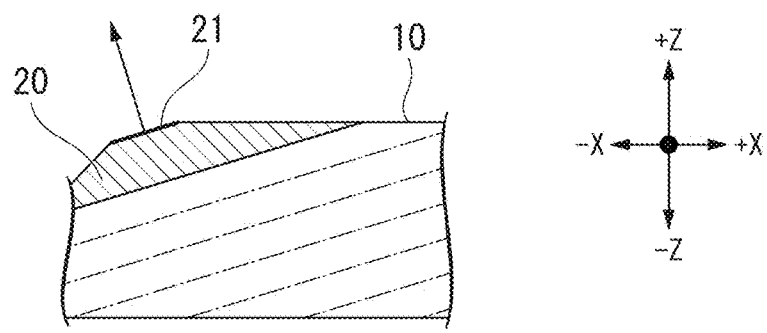
FIG. 2 is a cut surface obtained by cutting a portion of the SiC single crystal seed shown in FIG. 1 through the surface A-A'.

FIG. 1 is schematic plan view of a portion of a SiC single crystal seed according to one aspect of the present invention. FIG. 2 is a cut surface cut obtained by cutting a portion of the SiC single crystal seed shown in FIG. 1 through the surface A-A'. FIG. 1 illustrates only a fixed region containing an initial facet formation surface 21 centered within an enclosed circle.

The SiC single crystal seed 100 has a main surface 10 having an offset angle relative to the {0001} plane of at least 2° but not more than 20°, and at least one sub-growth surface 20. The sub-growth surfaces 20 include an initial facet formation surface 21 that is on the otffset upstream side of the main surface 10 and has an inclination angle θ relative to the {0001} plane with an absolute value of less than 2° in any direction. The initial facet formation surface 21 has screw dislocation starting points 30.

In the present invention, a "screw dislocation starting point" describes a starting point where a screw dislocation can form during the crystal growth process. For example, screw dislocations that exist in the SiC single crystal seed from the start function as threading dislocations that are simply inherited in the c-face direction, and are therefore usually inherited in the growing crystal. Accordingly, screw dislocations that exist from the start in the SiC single crystal seed function as screw dislocation starting points. Further, screw dislocation starting points can also be produced artificially by subjecting the surface of the SiC single crystal seed to some form of treatment. For example, by forming a layer having a disturbed crystal structure at the surface by performing mechanical processing or ion injection or the like, screw dislocations can be generated from this layer of disturbed crystal structure during the growth process. This is because in order to grow an aligned crystal structure on the layer having a disturbed crystal structure, the disturbance must be absorbed in some form. For example, it is thought that a disturbance in the <0001> direction parallel with the growth direction is absorbed by conversion to a screw dislocation or micropipe having a Burgers vector parallel with <0001>, or to a Frank stacking fault or the like, whereas a disturbance in the <11-20> direction or <1-100> direction perpendicular to the growth direction is absorbed by conversion to a threading edge dislocation or basal plane dislocation having a Burgers vector parallel with the direction, or to a Shockley stacking fault or the like.

In the present description, the term "offset upstream side" means the side that becomes the starting point for step-flow growth. To give a specific example, the −X direction in FIG. 1 corresponds with the offset upstream side, and the +X direction corresponds with the offset downstream side.

(Main Surface)

The main surface 10 is a surface having an offset angle relative to the {0001} plane of at least 20 but not more than 20°. In other words, as indicated by the alternate long and short dash line in FIG. 2, the {0001} plane has an inclination relative to the main surface 10. As a result, when the SiC single crystal seed 100 undergoes crystal growth in the +Z direction of FIG. 2, the main surface 10 can undergo step-flow growth.

The offset angle of the main surface 10 relative to the {0001} plane is at least 2° but not more than 20°, and is preferably at least 3° but not more than 9°. If the offset angle of the main surface 10 is too small, then any defects generated tend to flow downstream of the offset. If the defects do not flow in the offset downstream direction (the +X direction in FIG. 2), but are rather retained in a single location, then the defects do not decrease during growth, and are retained in the crystal. Furthermore, if the offset angle is too small, another problem arises in that if a slight deviation occurs in the growth shape, then a facet may occur in an unexpected position. The risk of different polytypes occurring in the facet growth region also increases.

On the other hand, if the offset angle is too large, then a temperature gradient causes stress in the c-face sliding direction (the direction parallel with the {0001} plane), increasing the likelihood of basal plane dislocations. Further, the difference from the offset angle (typically not more than 4°) of SiC wafers typically used in producing devices and the like becomes very large. As a result, SiC wafers must be cut diagonally from the SiC ingot, resulting in a reduction in the number of SiC wafers obtained.

The SiC single crystal seed acts as the crystal growth nucleus for producing a SiC ingot. Accordingly, in order to discuss the SiC ingot and SiC single crystal wafers, the state of the crystal growth process using the SiC single crystal seed must be considered. The aforementioned "facet" and "facet growth region" mean the surface and portion that grow up when the SiC single crystal seed undergoes crystal growth. More precisely, in the present invention, a "facet" is a flat crystal surface when viewed at the atomic scale in accordance with the geometric regularity of the crystal, and is a surface that appears as a flat surface due to the differences in growth mechanism during crystal growth. For example, a {0001} plane facet (c-face facet) is a surface parallel with the {0001} plane, and appears as a flat surface during crystal growth. Further, in the present description, a "facet growth region" refers to a region formed from a collection of portions having a facet formed on the outermost surface of the SiC ingot during the growth process. Compared with other regions that undergo step-flow growth, the facet growth region has a different impurity concentration due to the difference in growth mechanism. As a result, a facet growth region can be determined from the crystal following growth.

(Sub-Growth Surface, Initial Facet Formation Surface)

A "sub-growth surface" refers to a surface oriented in the growth direction other than the main surface which has the largest surface area. The "initial facet formation surface" is one example of a sub-growth surface, and is positioned on the offset upstream side of the main surface 10 and has an inclination angle θ relative to the {0001} plane with an absolute value of less than 2° in any direction.

Figure 3:
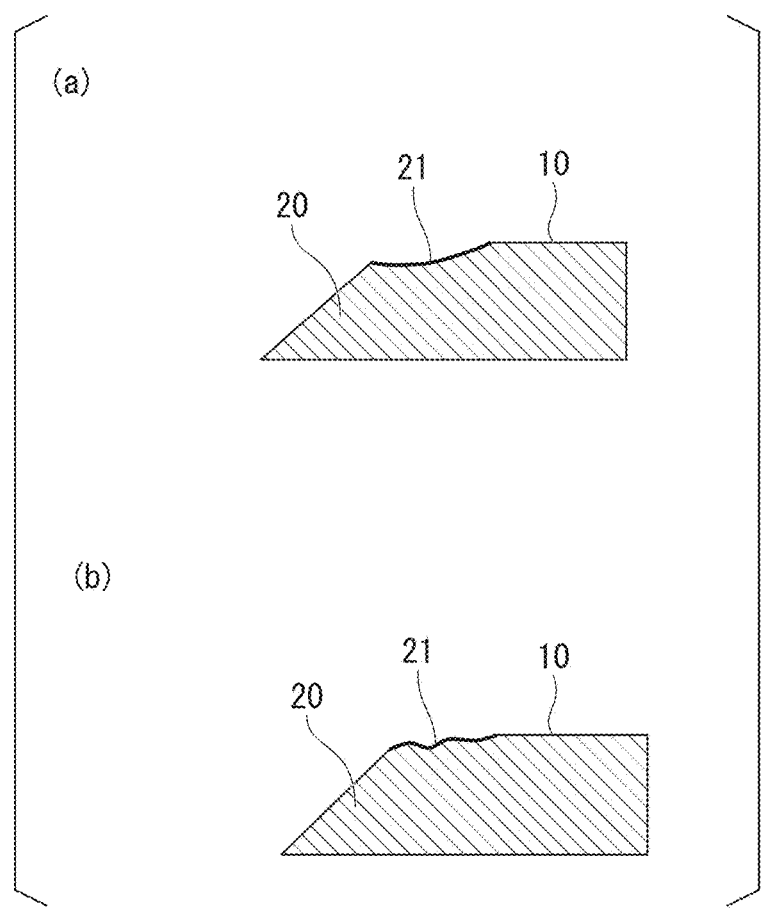
FIG. 3 is series of enlarged schematic cross sections illustrating the vicinity of the initial facet formation surface of SiC single crystal seeds according to an aspect of the present invention, showing cases where the initial facet formation surface is not a flat surface.

There may be a plurality of sub-growth surfaces 20. Further, the sub-growth surface 20 and the initial facet formation surface 21 may be flat surfaces as illustrated in FIG. 2, may be a curved surface as illustrated in FIG. 3(a), or may be an uneven surface in which the angles and uniforms are not uniform, as illustrated in FIG. 3(b).

Figure 4:
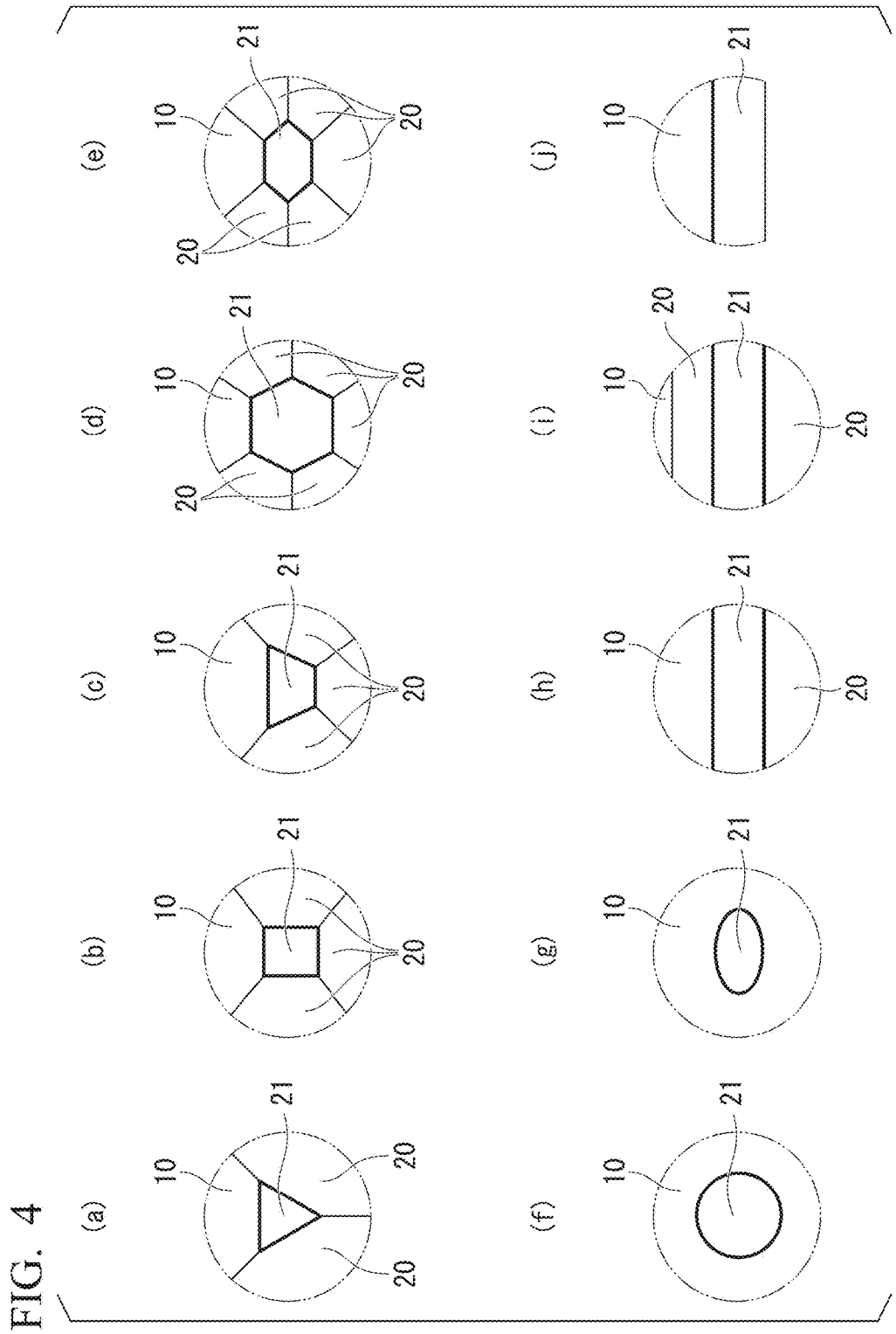
FIG. 4 is a series of enlarged schematic views illustrating the vicinity of the initial facet formation surface in other examples of SiC single crystal seeds according to an aspect of the present invention.

FIG. 4 is a series of enlarged schematic plan views illustrating the vicinity of the initial facet formation surface 21 in other examples of SiC single crystal seeds according to an aspect of the present invention. In a similar manner to FIG. 1, only a fixed region containing the initial facet formation surface 21 centered within an enclosed circle is shown. The bold lines in FIG. 4 indicate the boundary lines of each of the surfaces, and the line shown at the bottom of FIG. 4(j) indicates the end face of the single crystal seed. FIG. 4(j) represents the case where the initial facet formation surface 21 exists close to an end face of the single crystal seed, and the portions beyond the single crystal seed are not shown, meaning a portion of the circle is omitted.

The sub-growth surface 20 and the initial facet formation surface 21 can adopt a variety of structures as illustrated in FIG. 4. For example, in FIG. 4(j), there is only a single sub-growth surface, and that sub-growth surface is the initial facet formation surface 21. In FIGS. 4(h) and (i), sub-growth surfaces 20 are formed parallel with one edge of the SiC single crystal seed 100 (an edge perpendicular to the offset growth direction), and one of those surfaces is the initial facet formation surface 21. In each of FIGS. 4(a), (b), (c), (d) and (e), the sub-growth surfaces 20 are composed of a plurality of flat surfaces having different angles, and one of those surfaces is the initial facet formation surface 21. In FIGS. 4(f) and (g), the main surface 10 is a curved surface, and a sub-growth surface 20 formed on the main surface is the initial facet formation surface 21.

Figure 5:
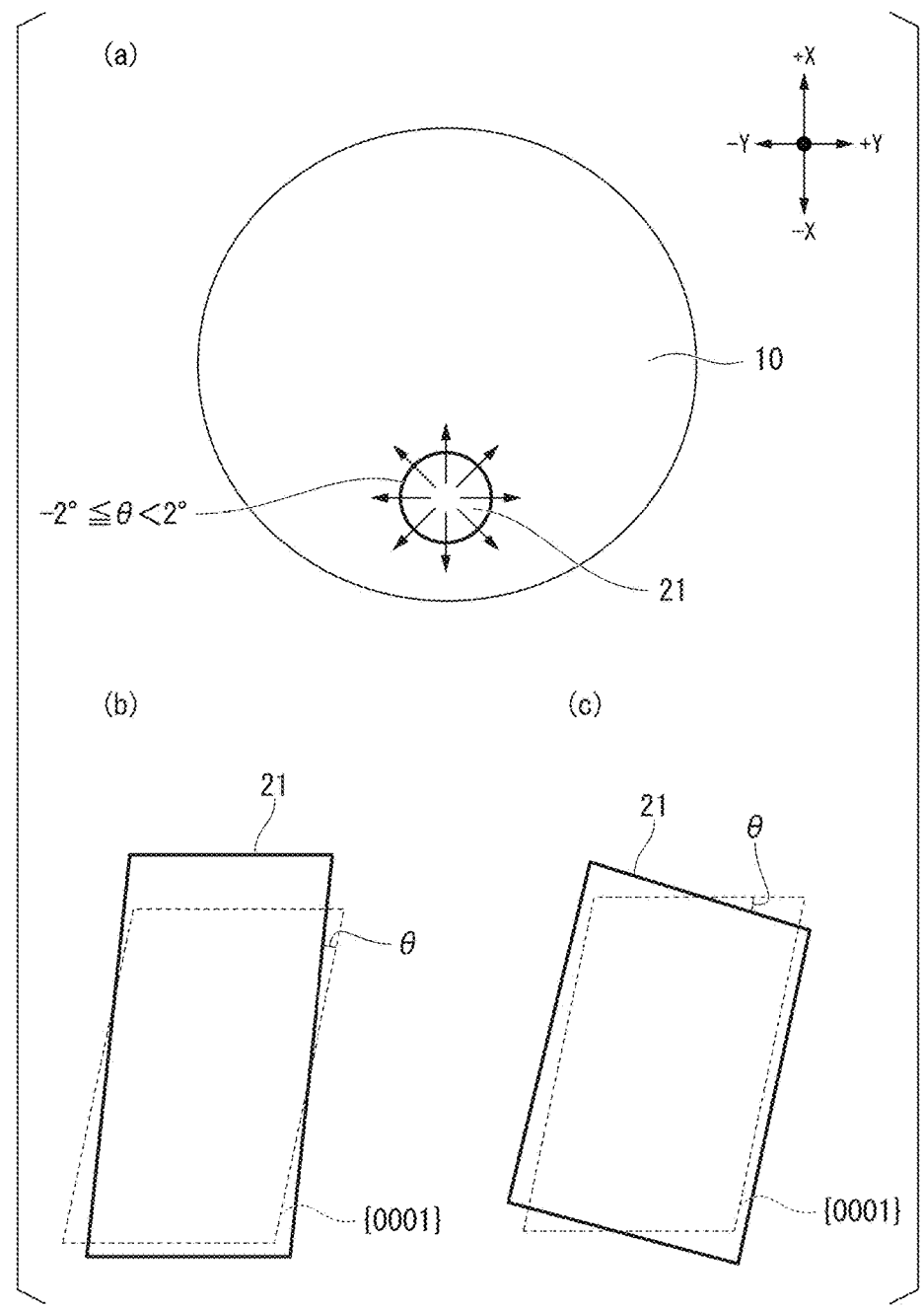
FIG. 5 is a schematic plan view illustrating an enlarged view of a portion of a SiC single crystal seed according to an aspect of the present invention, showing the main surface and the inclination direction and angle of the initial facet formation surface relative to the {0001} plane.

The initial facet formation surface 21 is on the offset upstream side of the main surface 10, and has an inclination angle θ relative to the {0001} plane with an absolute value of less than 2° in any direction. FIG. 5 is a schematic plan view illustrating an enlarged view of a portion of a SiC single crystal seed according to an aspect of the present invention, showing the main surface and the inclination direction and inclination angle θ of the initial facet formation surface relative to the {0001} plane.

The direction of inclination of the initial facet formation surface 21 relative to the {0001} plane may be any direction, as illustrated by the arrows in FIG. 5(a). For example, FIG. 5(b) schematically illustrates a case where the initial facet formation surface is inclined relative to the {0001} plane in the +X direction shown in FIG. 5(a), and FIG. 5(c) schematically illustrates a case where the initial facet formation surface is inclined relative to the {0001} plane in the ±Y direction shown in FIG. 5(a). As illustrated in FIG. 5(b) and FIG. 5(c), the inclination angle θ means the interior angle at which the {0001} plane and the initial facet formation surface 21 intersect.

If the initial facet formation surface 21 is substantially parallel with the {0001} plane, then crystal growth directly on the initial facet formation surface 21 does not occur as step-flow growth, and a facet is formed. Provided the inclination angle θ of the initial facet formation surface relative to the {0001} plane has an absolute value of less than 2° in any direction, the initial facet formation surface may be a curved surface such as that illustrated in FIG. 3(a), or an uneven surface having various angles and curvatures such as that illustrated in FIG. 3(b). By including the initial facet formation surface 21, the position in which the facet is formed is restricted to the offset upstream side.

For example, when the SiC single crystal seed has a cuboid shape having no sub-growth surfaces, the following types of problems arise when crystal growth is conducted on the SiC single crystal seed. When the SiC single crystal seed is a cuboid shape, a facet is formed in the vicinity of the most upstream corner of the offset (in the −X direction of the SiC single crystal seed). This is because step-flow growth occurs at all locations other than the vicinity of the most upstream corner of the offset. When a facet is formed at a point such as the corner described above, fixing the position at which the facet is formed is difficult regardless of the growth state, and the position at which the facet is formed may sometimes shift as growth progresses. In other words, in a SiC single crystal seed not having an initial facet formation surface, the position at which a facet is formed during crystal growth cannot be satisfactorily controlled.

Next is a description of the formation of a facet directly on an initial facet formation surface 21 having an inclination angle θ relative to the {0001} plane with an absolute value of less than 2° in any direction.

Figure 6:
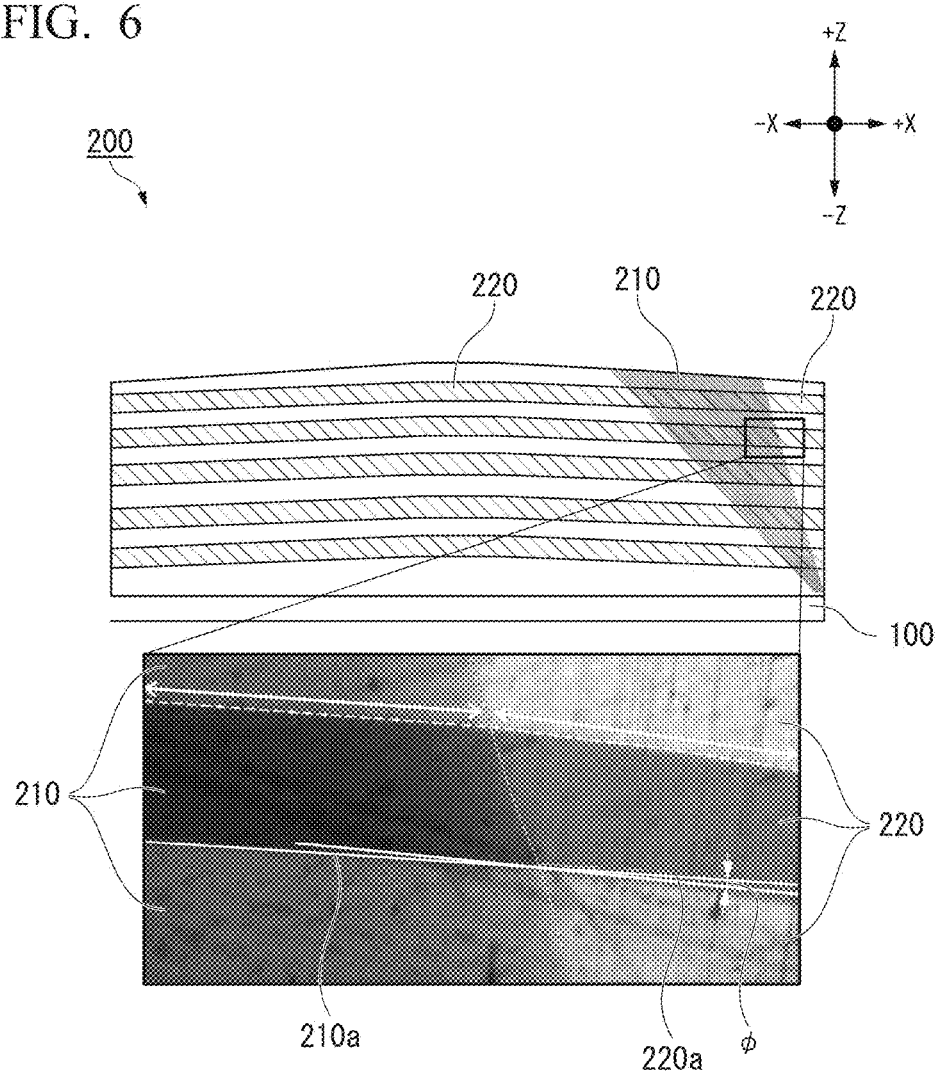
FIG. 6 is a schematic illustration of a cross section of a SiC ingot produced by crystal growth from a SiC single crystal seed according to one aspect of the present invention, and also shows an enlarged photograph of the interface between the step-flow growth region and the facet growth region.

FIG. 6 is a schematic illustration of a cross section of a SiC ingot 200 produced by crystal growth from the SiC single crystal seed 100, and also shows an enlarged photograph of the interface between a step-flow growth region 220 and a facet growth region 210. The facet growth region 210 is shown as a shaded portion in the drawing, with the remaining portion representing the step-flow growth region 220.

The SiC ingot 200 is obtained by crystal growth in the +Z direction from the SiC single crystal seed 100. The facet growth region 210 has a different growth mechanism form the step-flow growth region 220, and the impurity concentration also differs. Accordingly, as shown in the enlarged photograph of FIG. 6, the facet growth region 210 and the step-flow growth region 220 can also be distinguished by photograph. In FIG. 6, the interfaces between the different coloring tones that can be seen in a direction (±X direction) substantially perpendicular to the crystal growth direction (+Z direction) are growth interfaces 210a and 220a formed at certain times by changing the flow rate of the impurity $N_2$. Further, the growth interface 210a of the facet growth region is generally linear, whereas the growth interface 220a of the step-flow growth region is curved.

The following description focuses on the boundary between the growth interface 210a of the facet growth region 210 and the growth interface 220a of the step-flow growth region 220. The growth interface 210a of the facet growth region 210 and the growth interface 220a of the step-flow growth region 220 break at the boundary between the two. In other words, a continuation of the growth interface 210a of the facet growth region 210 and the growth interface 220a of the step-flow growth region 220 intersect at an angle φ. As mentioned above, the facet growth region 210 has a facet on the outermost surface of the SiC ingot during the growth process. In other words, because the growth interface 210a of the facet growth region 210 corresponds with the outermost surface of the SiC ingot during the growth process, it is parallel with the {0001} plane.

Consequently, it can be stated that the growth interface 220a of the step-flow growth region 220 deviates from the {0001} plane by the angle φ. In other words, in regions that deviate from the {0001} plane by the angle φ or greater, crystal growth occurs by step-flow growth. Alternatively, considering the opposite viewpoint, in a region where the absolute value of the angle deviation from the {0001} plane is less than the angle φ, growth occurs while forming a facet. As illustrated in FIG. 6, when the cross section of the SiC ingot 200 is checked following crystal growth, this angle φ is a maximum of 2°. Accordingly, provided the initial facet formation surface 21 exhibits an angle deviation relative to the {0001} plane with an absolute value of less than 2° in any direction, a facet is formed directly on the initial facet formation surface. In other words, by providing an initial facet formation surface 21 having an inclination angle θ relative to the {0001} plane with an absolute value of less than 2° in any direction, a facet can be formed directly on the initial facet formation surface 21 during the process of growing a SiC single crystal ingot.

Figure 7:
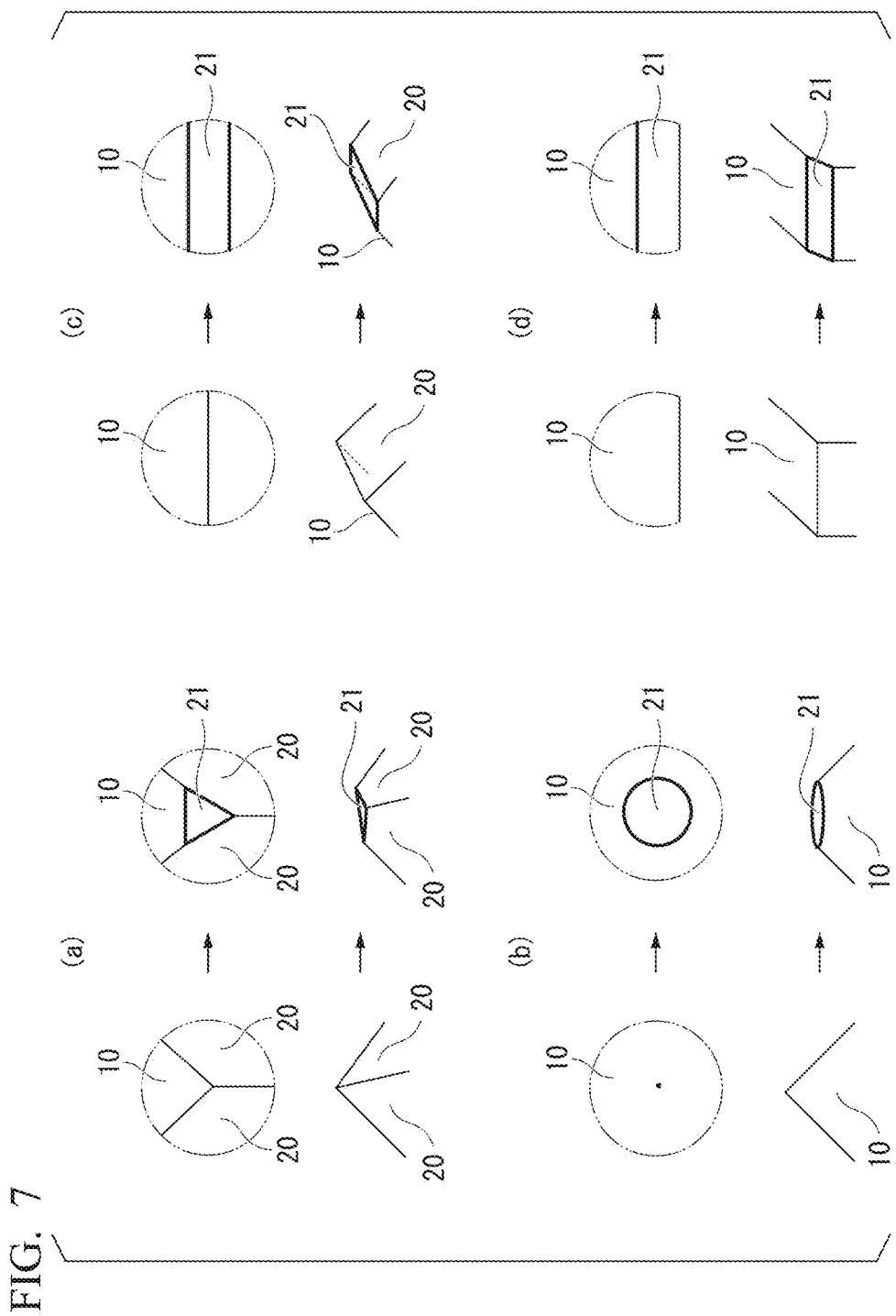
FIG. 7 is a series of schematic plan views and three-dimensional schematic views showing the states before and after formation of the initial facet formation surface of SiC single crystal seeds according to one aspect of the present invention.

The initial facet formation surface 21 is preferably a top surface formed by cutting an apex formed by the main surface 10 and at least two sub-growth surfaces 20. FIG. 7 is a series of schematic plan views and three-dimensional schematic views showing the states before and after formation of the initial facet formation surface of SiC single crystal seeds according to an aspect of the present invention. In FIGS. 7(a) to (d), the upper drawing is a schematic plan view and the lower drawing is a three-dimensional schematic view. Further, the left-hand drawings show the state prior to formation of the initial facet formation surface, and the right-hand drawings show the state following formation of the initial facet formation surface.

For example, as illustrated in FIG. 7(a), the initial facet formation surface 21 may be formed by cutting two adjacent corners of a cuboid SiC single crystal seed, and then cutting the resulting apex formed by the two sub-growth surfaces 20 and the main surface 10 substantially parallel with the {0001} plane. Alternatively, the initial facet formation surface 21 may be formed in the manner shown in any of FIG. 7(b) to FIG. 7(d). FIG. 7(b) illustrates a case where a region including a sub-growth surface is processed into a cone shape, and the apex of the cone is then cut substantially parallel with the {0001} plane to form the initial facet formation surface 21. FIG. 7(c) illustrates a case where a corner of a cuboid SiC single crystal seed is cut, and the resulting edge formed between a single sub-growth surface 20 and the main surface 10 is then cut substantially parallel with the {0001} plane to form the initial facet formation surface 21. FIG. 7(d) illustrates a case where an edge formed by the main surface 10 of a cuboid SiC single crystal seed and a seed side surface is cut substantially parallel with the {0001} plane to form the initial facet formation surface 21.

A top surface obtained by cutting an apex formed by the main surface 10 and two sub-growth surfaces 20 has the same shape as the upper surface of a plateau. Because this upper surface is a limited region, the proportion of the SiC single crystal seed 100 represented by the initial facet formation surface 21 tends to be small. In other words, when crystal growth is performed from the SiC single crystal seed 100, the surface area of the region in which the facet is formed can be reduced. Further, as described below, a plurality of screw dislocation starting points are provided on the initial facet formation surface 21. As a result, by restricting the size of the initial facet formation surface 21, the screw dislocations that occur during growth can be restricted within a predetermined range. This means that a high-quality SiC ingot and SiC wafers can be obtained.

The initial facet formation surface 21 exists offset upstream of the main surface 10, and has screw dislocation starting points 30. Because the initial facet formation surface 21 has these screw dislocation starting points 30, when the SiC single crystal seed is subjected to crystal growth, the occurrence of different polytypes in the growing SiC crystal, and the occurrence of defects that typically accompany the outflow of crystal dislocations can be suppressed.

The screw dislocation starting points 30 are most preferably screw dislocations that are present in the SiC single crystal seed from the start. If the screw dislocation starting points 30 are screw dislocations that are present in the SiC single crystal seed from the start, then any increase or decrease in the number of screw dislocations or any change in the positions of the screw dislocations during the growth process can be suppressed. Because any one of the screw dislocations provided in the SiC single crystal seed from the start is a threading dislocation, this dislocation also functions as one screw dislocation during the growth process. In contrast, if a screw dislocation starting point is, for example, a crystal distortion or the like, then a plurality of screw dislocations may sometimes occur during the growth process. In other words, there is a possibility that these starting points may cause an increase or decrease in the number of screw dislocations, or a change in the position of the screw dislocations. Even in the case of introduction of these types of screw dislocation starting points other than screw dislocations that are present in the SiC single crystal seed from the start, by controlling the introduction density and introduction strength when introducing the screw dislocation starting points, the number and positions of the screw dislocations that occur in the initial stage can be controlled. However, by using screw dislocations that are present in the SiC single crystal seed from the start, screw dislocations can be reliably introduced during the growth process even without controlling the introduction density or introduction strength or the like.

Figure 8:
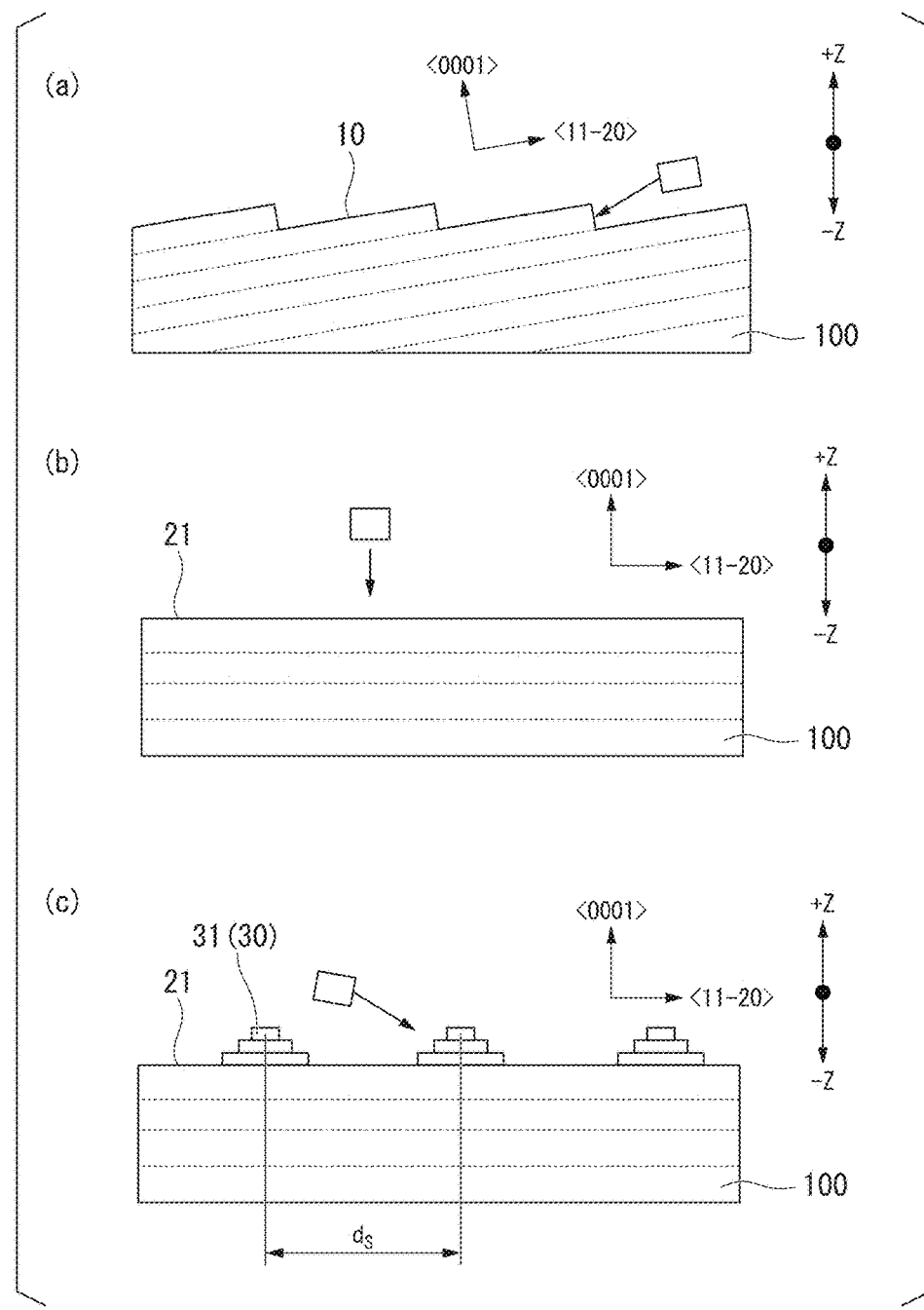
FIG. 8(a) is a schematic view schematically illustrating step-flow growth.
FIG. 8(b) is a schematic view schematically illustrating facet growth.
FIG. 8(c) is a schematic view schematically illustrating facet growth in the case where screw dislocations exist.

Next is a description, using FIG. 8, of the differences in crystal growth, and the reasons that providing the screw dislocation starting points 30 enables suppression of the occurrence of different polytypes and the occurrence of defects that accompany the outflow of crystal dislocations. FIG. 8(a) is a drawing schematically illustrating step-flow growth, (b) is a drawing schematically illustrating facet growth, and (c) is a drawing schematically illustrating facet growth in the case where screw dislocations exist. The dotted lines in FIG. 8 indicate the {0001} plane.

In FIG. 8(a), the crystal growth surface (the surface on the +Z side of the SiC single crystal seed 100) has an offset angle relative to the (0001 plane, and corresponds with the main surface 10. In contrast, in FIGS. 8(b) and (c), the crystal growth surface (the surface on the +Z side of the SiC single crystal seed 100) is parallel with the {0001} plane, and corresponds with the initial facet formation surface 21.

The SiC crystal structure has polytypes including 3C—SiC, 4H—SiC, and 6H—SiC and the like. When viewed from the c-face direction (the <0001> direction), these different crystal structures have no differences in their respective outermost surface structures. Accordingly, when crystal growth occurs in the c-face direction, the crystal structure can easily change to a different polymorph. In contrast, when viewed from the a-face direction (the <11-20> direction), the outermost surface structures have differences in crystal structure. Accordingly, in the case of crystal growth in the a-face direction, these polymorphic differences in crystal structure can be inherited.

As illustrated in FIG. 8(a), in step-flow growth, the overall SiC single crystal seed 100 grows in the +Z direction while the crystal grows in the a-face direction. In other words, because crystal growth occurs in a form that inherits information from the a-face, the crystal structure (polymorphic differences) can be inherited. On the other hand, in a case such as that shown in FIG. 8(b), where the crystal growth surface is parallel with the {0001} plane, the overall SiC single crystal seed 100 grows in the +Z direction while the crystal undergoes island growth in the c-face direction. Because polymorphic information cannot be obtained from the c-face, the crystal structure (polymorphic differences) cannot be inherited, and different polytypes tend to occur.

In contrast, the crystal growth surface of FIG. 8(c) has screw dislocations 31. If the screw dislocations 31 did not exist in FIG. 8(c), then island growth would occur in a similar manner to FIG. 8(b), and the occurrence of different polytypes could not be suppressed. However, because of the existence of the screw dislocations 31, the screw portions of the screw dislocations 31 form steps, making growth in the a-face direction possible, and enabling inheritance of the crystal structure (polymorphic differences). In FIG. 8(c), the screw dislocations 31 were used as one example of the screw dislocation starting points 30, but even in those cases where screw dislocation starting points other than the screw dislocations 31 exist, because the screw dislocation starting points 30 give rise to the screw dislocations 31 immediately upon crystal growth, the result is similar.

Next is a description of the existence of the initial facet formation surface 21 on the offset upstream side of the main surface 10. As illustrated in FIG. 8(a), in the case of step-flow growth, the overall SiC single crystal seed 100 grows in the +Z direction while the crystal grows in the a-face direction. As a result, the offset upstream side information is easily conveyed to the offset downstream side. Accordingly, if the initial facet formation surface 21 having screw dislocation starting points 30 is provided on the offset upstream side, enabling suppression of the occurrence of different polytypes and the occurrence of defects that accompany the outflow of crystal dislocations, then this leads to a simultaneous suppression of the occurrence of defects on the offset downstream side. In other words, flow of screw dislocations and different polytypes and the like into the high-quality region obtained as a result of crystal growth on the main surface 10 is suppressed, enabling the production of a SiC ingot of superior quality.

The effective screw dislocation starting point density of the initial facet formation surface 21 is preferably at least $16/cm^2$ but not more than $1.000/cm^2$. Here, the "effective screw dislocation starting point density" does not represent the numerical density of the starting points (screw dislocations or defects) themselves, but rather indicates the "screw dislocation density" generated by the "screw dislocation starting points" upon crystal growth. In those cases where the "screw dislocation starting points" are "screw dislocations", the "effective screw dislocation starting point density" is the "screw dislocation density" present in the SiC single crystal seed from the start.

As described above, by including the screw dislocation starting points 30, growth in the a-face direction becomes possible, and the crystal structure (polymorphic differences) can be inherited. However, even when the screw dislocation starting points 30 exist on the initial facet formation surface 21, if the distance between screw dislocation starting points 30 (corresponding with $d_S$ in FIG. 8(c)) is too large, then there is a possibility that island growth may occur in the region between adjacent screw dislocation starting points 30, resulting in the occurrence of different polytypes.

As a result of investigations, it was confirmed experimentally that provided the screw dislocation density within the initial facet was at least $16/cm^2$, different polytypes did not occur, whereas if the density was less than $16/cm^2$, the probability of the occurrence of different polytypes is increased than when the condition is satisfied. In other words, provided the initial facet has a screw dislocation density of at least $16/cm^2$, the occurrence of different initial polytypes can be prevented. Accordingly, the initial facet formation surface preferably has an effective screw dislocation starting point density of at least $16/cm^2$.

On the other hand, if the density of the screw dislocation starting points 30 is too high, then the chances of cracks or the like occurring tend to increase. This is because a high density of the screw dislocation starting points 30 is equivalent to a large defect density within the SiC single crystal seed 100.

Further, the screw dislocation density of the initial facet formation surface is preferably at least $16/cm^2$ but not more than $1,000/cm^2$.

As described above, screw dislocations that are present in the SiC single crystal seed from the start are the most desirable as the screw dislocation starting points. When a screw dislocation starting point is a screw dislocation that is present in the SiC single crystal seed from the start, a single screw dislocation occurs during the growth process. Accordingly, compared with other screw dislocation starting points, both the number and positions of the screw dislocations generating during the growth stage can be more easily controlled.

It is preferable that the number of the sub-growth surfaces, including the initial facet formation surface, is at least three, and that each edge of the initial facet formation surface has a common edge with the main surface or a sub-growth surface. If the effective screw dislocation starting point density on the initial facet formation surface 21 is high, then the probability of the introduction of screw dislocations into the initial facet increases, and the probability of the occurrence of different polytypes decreases. However, even when the effective screw dislocation starting point density on the initial facet formation surface 21 is high, different polytypes may still sometimes occur. One such case is when the surface area of the initial facet formation surface 21 is extremely small, meaning screw dislocations cannot be satisfactorily introduced into the initial facet. Another case is when screw dislocations are introduced into the initial facet, but the distance $d_S$ (see FIG. 8(c)) between the screw dislocations is too large. As the initial facet formation surface increases in size, portions in which the distance between the screw dislocations (corresponding with $d_S$ in FIG. 8(c)) is too large are more likely to exist. In other words, portions develop in which island growth may occur between adjacent screw dislocation starting points 30, resulting in a weakening of the different polytypes suppression effect.

Accordingly, even for initial facet formation surfaces having the same surface area, as the maximum diameter of a circumscribed circle around the initial facet formation surface increases, the likelihood of increased spacing between screw dislocations also increases. Consequently, for any given surface area, the maximum diameter of a circumscribed circle around the initial facet formation surface is preferably as small as possible. Specifically, as illustrated in FIGS. 4(a) to (e), the initial facet formation surface is preferably formed following the circumscribed circle around the initial facet formation surface. In contrast, in cases such as FIGS. 4(h), (i) and (j), where each edge of the initial facet formation surface does not have a common edge with the main surface or a sub-growth surface, the initial facet formation surface lengthens in one direction, and the maximum diameter of the circumscribed circle around the initial facet formation surface increases undesirably.

The surface area of the initial facet formation surface 21 is preferably at least 1 $mm^2$, more preferably at least 10 $mm^2$, and even more preferably 25 $mm^2$ or greater. When the initial facet formation surface 21 is larger, screw dislocations can be more easily introduced from the start in the facet formed directly on the initial facet formation surface 21, enabling a better reduction in the occurrence of different polytypes and the like. If the initial facet formation surface is too small, then satisfactorily introducing screw dislocations into the initial facet surface can become difficult. This is because if the initial facet formation surface is too small, then surface sag is more likely to occur during processing such as CMP, and formation of an appropriate surface becomes difficult. Further, in those cases where screw dislocations exist within the SiC single crystal seed from the start, the positions are determined and the initial facet formation surface is formed based on X-ray topography. Even in this case, if the surface area is too small, then setting the initial facet formation surface in a prescribed location becomes difficult. Moreover, in those cases where new screw dislocation starting points are introduced, if the surface area is small, then the introduction is more difficult.

If the effective screw dislocation starting point density is termed d (/cm$^2$), then the surface area A (cm$^2$) of the initial facet formation surface 21 preferably satisfies $0.5 \leq 1-(1-A)^{d-1}(1-A+dA)$.

Provided the surface area of the initial facet formation surface 21 has an appropriate size, there is an increased likelihood of screw dislocations being introduced from the start in the facet formed directly on the initial facet formation surface 21, and the occurrence of different polytypes and the like can be further reduced.

A minimum of at least one screw dislocation is required within the initial facet formation surface, but a larger number of screw dislocations is preferred in terms of preventing the occurrence of different polytypes. This is because in the case of one screw dislocation, if the position of the facet formation surface changes during the subsequent crystal growth, the screw dislocation may no longer exist within the facet, and there is an increased chance of different polytypes occurring. Further, there is also a possibility that locations that are distant from the screw dislocation (locations where the influence of the screw dislocation is small) may develop, meaning there is still a possibility of different polytypes occurring.

Accordingly, in order to more reliably prevent different polytypes, the initial facet formation surface preferably includes at least two screw dislocations.

The probability that two or more screw dislocations are included within the initial facet formation surface can be calculated by subtracting the probability of no screw dislocations being included in the initial facet formation surface and the probability of only one screw dislocation being included in the initial facet formation surface from a value of 1. The probability $X_0$ of no screw dislocations being included in the initial facet formation surface can be represented by $X_0 = {}_dC_0(A)^0(1-A)^d$, and the probability $X_1$ of only one screw dislocation being included in the initial facet formation surface can be represented by $X_1 = {}_dC_1(A)^1(1-A)^{d-1}$. Here, d is the effective screw dislocation starting point density (/cm$^2$).

Accordingly, the probability X that two or more screw dislocations are included within the initial facet formation surface can be represented by $X = 1 - X_0 - X_1 = 1 - {}_dC_0(A)^0(1-A)^d - {}_dC_1(A)^1(1-A)^{d-1} = 1 - (1-A)^{d-1}(1-A+dA)$. Based on this formula, it can be calculated, for example, that the surface area A required to ensure that at least two screw dislocations are introduced into the initial facet formation surface at a probability of at least 50% must satisfy $0.5 \leq 1-(1-A)^{d-1}(1-A+dA)$.

For the initial facet formation surface 21, the "maximum diameter $D_{F1}$ of a circumscribed circle" and the "maximum diameter $D_{F2}$ of an inscribed circle" of the initial facet formation surface 21 preferably satisfy the relationship $D_{F1}/D_{F2}<4$. As described above, even if screw dislocation starting points 30 exist on the initial facet formation surface 21, if the distance between screw dislocation starting points 30 (corresponding with $d_S$ in FIG. 8(c)) is too large, then a possibility remains that island growth may occur in the region between adjacent screw dislocation starting points 30, resulting in the occurrence of different polytypes. Accordingly, for a given surface area for the initial facet formation surface, the larger the value of the maximum diameter $D_{F1}$ of a circumscribed circle, the greater the likelihood of the distance $d_S$ between screw dislocation starting points becoming excessively large. As a result, in order to more reliably prevent the occurrence of different polytypes, a higher effective screw dislocation starting point density is required. Accordingly, for a given surface area, the maximum diameter is preferably as small as possible. More specifically, the relationship between the "maximum diameter $D_{F1}$ of a circumscribed circle" and the "maximum diameter $D_{F2}$ of an inscribed circle" preferably satisfies $D_{F1}/D_{F2}<4$, more preferably satisfies $D_{F1}/D_{F2}<2$, and even more preferably satisfies $D_{F1}/D_{F2} \approx 1$. In terms of shape, as illustrated in FIG. 4(d), a higher number of sides is preferred for a polygonal shape, as this yields a smaller difference between the maximum diameters of the circumscribed circle and the inscribed circle. A perfect circle where $D_{F1}/D_{D2}=1$ such as that illustrated in FIG. 4(f) is the most desirable.

At least one edge where the main surface 10 contacts the initial facet formation surface 21 is preferably substantially perpendicular to the offset direction. Specifically, shapes such as those shown in FIGS. 4(a) to (e) are preferred. Provided this type of structure is provided, the configuration formed by the main surface 10 and the initial facet formation surface 21 remains stable during crystal growth, enabling the growth to be stabilized. The offset direction is the direction of the vector obtained by projecting the normal vector to the crystal growth direction onto the growth surface, and means the ±X direction in FIG. 5, and is typically substantially parallel with the <11-20> direction. The term "substantially perpendicular" means that the angle formed between the edge that forms the initial facet formation surface 21 and the offset direction is within a range of about 90±5°. During step-flow growth, when viewed microscopically, growth occurs in the inclined direction of the surface, and therefore growth occurs in the <11-20> direction. In other words, because step-flow growth in the <11-20> direction is the most stable, if at least one edge where the main surface 10 contacts the initial facet formation surface 21 is substantially perpendicular to the offset direction, then growth is not inhibited, and stable growth can be achieved.

Further, the same comment can be made for the other 5 directions equivalent to <11-20> which form an angle of 60×n° (wherein n is a natural number of n≤5) with <11-20> on the {0001} plane. In other words, when at least one edge where the main surface contacts the initial facet formation surface is substantially perpendicular to these directions, growth on all of the edges is stabilized, which is particularly desirable. Specifically, as illustrated in FIGS. 4(a), (d) and (e), the edges that form the initial facet formation surface are preferably substantially parallel with the edge, or inclined with an angle of 60°.

The screw dislocation density of a surface positioned offset downstream from the initial facet formation surface 21 is preferably not more than 15/cm². Here, the surface positioned offset downstream of the initial facet formation surface 21 is the direction in which crystal growth proceeds during step-flow growth, and means the main surface 10 in the configurations shown in FIG. 1 and FIG. 2. Furthermore, in the configuration of FIG. 4(*i*), it means the main surface 10 and the upper side sub-growth surface 20 not shown in the drawing. Screw dislocation starting points are portions where the crystal is inherently disturbed, and are therefore preferably minimized in order to obtain a high-quality SiC ingot. On the other hand, as described above, from the viewpoint of suppressing the occurrence of different polytypes and the occurrence of defects that typically accompany the outflow of crystal dislocations, screw dislocations are necessary in the growth process, meaning screw dislocation starting points sufficient to generate those screw dislocations (an effective screw dislocation starting point density exceeding 15/cm²) are essential.

However, in the present invention, because the initial facet formation surface 21 has the screw dislocation starting points 30, the occurrence of different polytypes and the occurrence of defects that typically accompany the outflow of crystal dislocations can also be suppressed in the offset downstream region from the initial facet formation surface. In other words, in the SiC single crystal seed 100, even if the screw dislocation density of surfaces positioned on the offset downstream side of the initial facet formation surface 21 is low, the occurrence of different polytypes and the occurrence of defects that accompany the outflow of crystal dislocations can still be satisfactorily suppressed. As a result, in the surfaces positioned offset downstream, portions of crystal disturbances and screw dislocations are preferably minimized as far as possible. The screw dislocation density is preferably not more than the 15/cm² that has conventionally been considered essential to suppress the occurrence of different polytypes and the occurrence of defects that accompany the outflow of crystal dislocations.

If the diameter of a circumscribed circle of the single crystal seed 100 is termed $D_S$, then the initial facet formation surface 21 preferably exists in a position that is separated from the center of the overall single crystal seed 100 by at least $D_S/4$.

Provided the initial facet formation surface 21 exists in a position distant from the center of the SiC single crystal seed 100, the facet growth region during growth can be restricted to positions near the outer periphery. In other words, a high-quality SiC ingot and SiC wafers with fewer defects can be obtained.

The initial facet formation surface 21 preferably does not have a damage layer. Here, a "damage layer" means a layer in which the crystal structure has been disturbed due to cutting, grinding or polishing or the like, resulting in the development of internal stress. Disturbances in the crystal structure can be observed by X-ray topography or X-ray rocking curve analysis. Crystal structure disturbances include a region where a distortion has occurred in the original crystal structure, and therefore the angle of diffraction changes. As a result, these disturbances can be detected from the contrast in X-ray topography, or from an increase in the full width at half maximum (FWHM) of the peak in the X-ray blocking curve. Further, because crystal structure disturbances represent a distortion from the inherent stable structure, they tend to be slightly unstable, and are removed preferentially during chemical etching. On a surface that has been subjected to cutting or grinding, a layer of not more than several tens of μm in which the crystal lattice has been disturbed is generated. If crystal growth is performed on top of this layer having a disturbed crystal lattice, then dislocations and stacking faults and the like are introduced into the growing crystal due to the crystal structure disturbances. As a result, defects other than the controlled screw dislocation starting points 30 are formed directly on the initial facet formation surface 21, causing a deterioration in the quality of the SiC ingot obtained from the SiC single crystal seed 100. This layer having a disturbed crystal structure can be eliminated by using etching that is not accompanied by external forces, or chemical mechanical polishing (CMP) that uses abrasive grains that are softer than the SiC of the parent phase.

The initial facet formation surface 21 preferably has a step. Here, a "step" is a level difference structure formed at the atomic scale when viewed in accordance with the geometric regularity of the crystal. The initial facet formation surface 21 is substantially parallel with the {0001} plane, but when viewed at the atomic scale, there is no necessity for the entire initial facet formation surface 21 to form a single flat surface. In other words, the initial facet formation surface 21 may be substantially parallel with the {0001} plane, but formed from a plurality of surfaces having different heights when viewed at the atomic scale. In such a case, a level difference occurs at the boundary portion between each of these surfaces of different height, and the a-face is exposed. Accordingly, if the initial facet formation surface 21 has a step, then a portion of the initial facet formation surface 21 can undergo step-flow growth from the initial stage of crystal growth, and therefore the occurrence of different polytypes and the occurrence of defects that typically accompany the outflow of crystal dislocations can be better suppressed.

As described above, the screw dislocation starting points 30 may be screw dislocations incorporated in the SiC single crystal seed 100, or may be artificially provided starting points. In either case, the starting points become screw dislocations on the facet during the initial stage of growth, enabling suppression of the occurrence of different polytypes and the occurrence of defects that typically accompany the outflow of crystal dislocations.

The screw dislocations incorporated in the SiC single crystal seed 100 are screw dislocations that the SiC single crystal seed 100 has from the start. The SiC single crystal seed 100 is produced by cutting an ingot grown from a different seed. Accordingly, the SiC single crystal seed 100 often includes screw dislocations from the start. On the other hand, in the case of recent SiC single crystal seeds prepared by slicing an ingot that has undergone a-face growth, the screw dislocation density in the seed is extremely low at the beginning. In such cases, the screw dislocation density in the initial facet formation surface 21 of the SiC single crystal seed 100 cannot be said to be adequate. Accordingly, in such cases, mechanical processing such as ion injection or grinding is preferably used to artificially provide starting points that can give rise to screw dislocations. The density of screw dislocations can be confirmed by X-ray topography or the like.

In other words, when crystal growth is performed using the SiC single crystal seed 100, only an adequate amount of screw dislocations need be introduced, and the number of screw dislocation starting points may be adjusted as appropriate.

(SiC Ingot)

Figure 9:
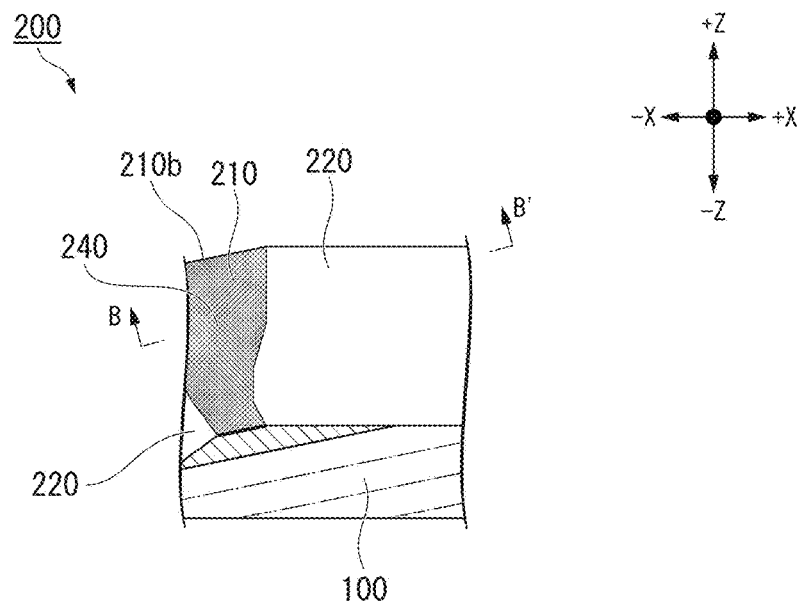
FIG. 9 is a schematic cross-sectional view of a portion of a SiC ingot according to an aspect of the present invention.
Figure 10:
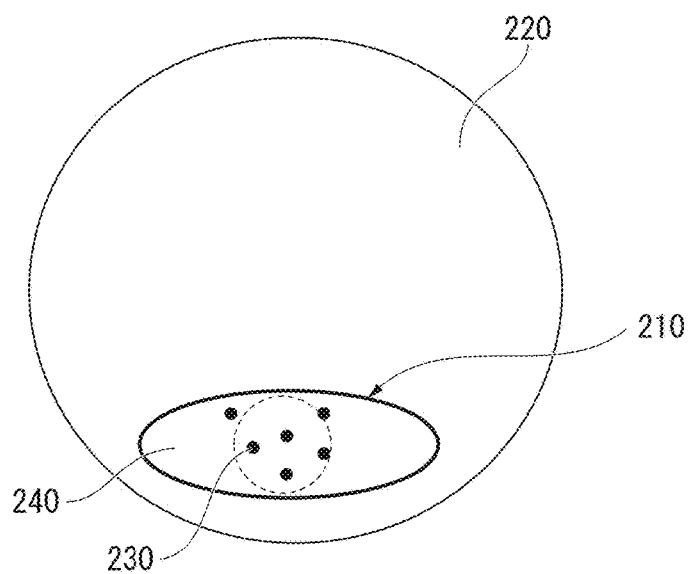
FIG. 10 is a drawing schematically illustrating a portion of a cut surface obtained by cutting the ingot shown in FIG. 9 through the surface B-B'.

FIG. 9 is a drawing schematically illustrating a cross section of a portion of a SiC ingot according to an aspect of the present invention. Further, FIG. 10 is a drawing schematically illustrating the vicinity of a facet growth region of a cut surface obtained by cutting the SiC ingot shown in FIG. 9 through the surface B-B'.

The SiC ingot 200 according to one aspect of the present invention is grown from the SiC single crystal seed 100 described above. The SiC ingot 200 has a facet growth region that extends across the entire region in the SiC growth direction from the initial facet formation surface of the SiC single crystal seed. Here, the "entire region in the SiC growth direction" means from the initial stage of growth until the completion of growth during growth of the SiC ingot, and in FIG. 9, means from the surface of the SiC single crystal seed 100 through to an outermost surface 210b of the facet growth region 210. Accordingly, the expression that the ingot "has a facet growth region that extends across the entire region in the SiC growth direction" means that the facet growth region is uninterrupted in the crystal growth direction. In this case, the facet growth region 210 is always of at least a certain fixed size, and this fixed size is preferably at least 1 mm². The facet growth region 210 grows from the initial facet formation surface, and provided the initial facet formation surface is at least 1 mm², processing is easier, and the level of screw dislocations can be more easily set appropriately.

The SiC ingot 200 is grown from the SiC single crystal seed 100. As a result, the history of the crystal growth in the growth stage is retained in the SiC ingot 200. Because SiC wafers used in the production of devices and the like are obtained by cutting the SiC ingot 200 with a wire saw or the like, a high-quality SiC ingot 200 is necessary to obtained high-quality SiC wafers. A determination as to whether or not the SiC ingot 200 is of high quality can be made by checking the growth history.

As described above, the SiC ingot 200 has the facet growth region 210 and the step-flow growth region 220. The facet growth region 210 and the step-flow growth region 220 differ in terms of growth mechanism, and have different impurity concentrations. Accordingly, when a cross section of the SiC ingot 200 is inspected, the facet growth region 210 and the step-flow growth region 220 can be distinguished.

The facet growth region 210 is the region that grows from the initial facet formation surface 21 of the SiC single crystal seed 100 during the process of producing the SiC ingot 200 from the SiC single crystal seed 100. Accordingly, provided that the surface area A (cm²) of the initial facet formation surface satisfies $0.5 \leq 1-(1-A)^{d-1}(1-A+dA)$, the surface area A of a cut surface 240 cut through a surface orthogonal to the growth direction of the facet growth region 210 will also satisfy the relationship represented by $0.5 \leq 1-(1-A_f)^{d-1}(1-A_f+dA_f)$. Provided the surface area $A_f$ of this cut surface 240 satisfies the above formula, screw dislocation can be introduced into the cut surface 240, and the occurrence of different polytypes and the occurrence of defects that typically accompany the outflow of crystal dislocations can be reduced during the crystal growth process. In other words, provided the surface area $A_f$ of the cut surface 240 satisfies the above formula, the SiC ingot 200 is formed as a high-quality ingot with minimal different polytypes and defects, meaning high-quality SiC wafers can be obtained.

Next is a description of the screw dislocations 230 of the cut surface 240, and the occurrence of different polytypes and the occurrence of defects that accompany the outflow of crystal dislocations. The relationship between the screw dislocations 230 of the cut surface 240, and the occurrence of different polytypes and the occurrence of defects that accompany the outflow of crystal dislocations is, in principle, the same as the relationship between the screw dislocation starting points 30 of the initial facet formation surface 21 of the SiC single crystal seed 100, and the occurrence of different polytypes and the occurrence of defects that accompany the outflow of crystal dislocations.

As described above, screw dislocations are necessary in the SiC single crystal seed 100 in the initial stage of growth immediately following the start of crystal growth. Accordingly, by providing the screw dislocation starting points 30 in the initial facet formation surface 21, the position of facet formation in the initial stage of crystal growth can be controlled, and an adequate number of screw dislocations can be introduced into that facet.

In this regard, the cut surface 240 is a surface that is formed in the growth stage of forming the SiC ingot 200. Because the facet growth region 210 grows in the <0001> direction, the cut surface 240 thereof is parallel with the {0001} plane. In other words, when crystal growth occurs on this cut surface 240, this cut surface 240 functions in a similar manner to the initial facet formation surface 21 of the SiC single crystal seed 100. In other words, provided the cut surface 240 has the screw dislocations 230, the occurrence of different polytypes and the occurrence of defects that accompany the outflow of crystal dislocations can be reduced.

One difference is that in the case of the initial facet formation surface 21, the term screw dislocation starting points 30 is used, but in the case of the cut surface 240, the term screw dislocations 230 is used. The initial facet formation surface 21 exists prior to the start of crystal growth. Accordingly, the screw dislocation starting points include starting points that become screw dislocations in the growth stage. In contrast, the cut surface 240 is a surface that is formed during the growth process. Accordingly, at a stage partway through crystal growth, these starting points have generally become screw dislocations or micropipes, and are limited to screw dislocations or micropipes.

The screw dislocation density in the cut surface 240 of the facet growth region 210 is preferably at least 16/cm² but not more than 1,000/cm². The reason for this preference is the same as that described above for the effective screw dislocation starting point density on the initial facet formation surface 21. In the case of the facet growth region 210, the starting points have typically already become screw dislocations, and therefore the above definition uses the screw dislocation density rather than the effective screw dislocation starting point density. If the density of the screw dislocations 230 is too low, then the spacing between screw dislocations 230 increases, and different polytypes are more likely to occur. In contrast, if the density of the screw dislocations 230 is too high, then the chances of cracks or the like occurring tend to increase.

When viewed in plan view from a direction orthogonal of the c-face facet, the initial facet formation surface 21 of the SiC single crystal seed 100, and the c-face facet of the outermost surface 210b of the facet growth region 210 preferably overlap at least partially. Further, when viewed in plan view from a direction orthogonal to the c-face facet, the distance between the center of an inscribed circle of the initial facet formation surface 21 of the SiC single crystal seed 100, and the center of an inscribed circle of the c-face facet of the outermost surface 210b of the facet growth region 210 is preferably shorter than the distance obtained by adding the radius of the inscribed circle of the initial facet formation surface 21 of the SiC single crystal seed 100, and the radius of the inscribed circle of the c-face facet of the outermost surface 210b of the facet growth region 210.

Provided the initial facet formation surface 21 of the SiC single crystal seed 100 and the c-face facet of the outermost surface 210b of the facet growth region 210 overlap at least partially when viewed in plan view from a direction orthogonal to the c-face facet, the position of the facet growth region 210 that has a larger number of defects than the step-flow growth region 220 is restricted to the offset upstream end of the SiC ingot 200. As a result, the area ratio of the high-quality region of the SiC ingot 200 can be increased.

Furthermore, the facet growth region 210 is preferably on the offset upstream side of the center of the SiC ingot 200. Here, the center of the SiC ingot 200 means the position of the center of gravity of the SiC ingot 200. Provided the facet growth region 210 is on the offset upstream side of the center of the SiC ingot 200, the position of the facet growth region 210 is restricted to the offset upstream end of the SiC ingot 200. Further, the flow of defects toward the offset downstream side due to the screw dislocations 230 and the like of the facet can be suppressed. As a result, the area ratio of the high-quality region of the SiC ingot 200 can be increased.

(SiC Single Crystal Seed Production Method)

A production method for a SiC single crystal seed according to the present invention is a production method for a single crystal seed in which an initial facet formation surface includes a screw dislocation starting point, the method having a step of cutting a portion of a SiC single crystal, and forming a main surface having an offset angle of at least 2° but not more than 20° relative to the {0001} plane, and at least one sub-growth surface including an initial facet formation surface that is on the offset upstream side of the main surface and has an inclination angle θ relative to the {0001} plane with an absolute value of less than 2° in any direction.

First, a wire saw or the like is used to cut a SiC single crystal seed from a separate single crystal that has already been produced by crystal growth. This SiC single crystal from which the SiC single crystal seed is cut is preferably a high-quality single crystal with few defects of the like. If the quality of the SiC single crystal used as a foundation is high, then the SiC single crystal seed will also be of high quality. Provided the SiC single crystal seed is of high quality, the quality of the SiC ingot and SiC wafers obtained by crystal growth using the SiC single crystal seed can be improved.

A high-quality SiC single crystal having extremely few defects (including screw dislocations) can be obtained by the RAF method or the like. By slicing a high-quality SiC single crystal obtained by the RAF method, a high-quality single crystal seed can be produced. During this process, by adjusting the angle with which the SiC single crystal seed is sliced from the SiC single crystal, a main surface having an offset angle of at least 2° but not more than 20° relative to the {0001} plane can be formed.

Subsequently, the sub-growth surface is formed by cutting away a further portion of the sliced SiC single crystal seed. There are no particular limitations on the method used for forming the sub-growth surface, and conventional methods may be used. For example, a wire saw or the like may be used. For example, in order to produce the SiC single crystal seed 100 illustrated in FIG. 7, the two sub-growth surfaces 20 can be formed by cutting two adjacent corners positioned on the offset upstream side of a SiC single crystal seed that has been sliced in a cuboid shape.

Subsequently, an initial facet formation surface is formed that is on the offset upstream side of the main surface and has an inclination angle θ relative to the {0001} plane with an absolute value of less than 2° in any direction. In a similar manner to the sub-growth surface, this initial facet formation surface is formed by cutting away a portion of the SiC single crystal seed. The angle of deviation of the initial facet formation surface from the {0001} plane can be adjusted by ascertaining the crystal surface by X-ray topography, and then cutting the initial facet formation surface. Further, it is preferable that X-ray topography or the like is used to confirm that an adequate number of screw dislocations that function as screw dislocation starting points exist within the SiC single crystal, and that the initial facet formation surface is then cut so as to include those screw dislocations.

At this time, the surface area A ($cm^2$) of the initial facet formation surface is preferably set so as to satisfy the relationship formula below. As described above, if the effective screw dislocation starting point density of the initial facet formation surface is termed d (/$cm^2$), the probability X that at least two screw dislocations are included in the initial facet formation surface is represented by X=1-$(1-A)^{d-1}$(1-A+dA). Accordingly, the surface area A of the initial facet formation surface is preferably determined so that this probability X that at least two screw dislocations are included is greater than 0, and the surface area A of the initial facet formation surface is more preferably set so that the probability X is at least 0.5. By forming the initial facet formation surface in this manner, a plurality of screw dislocations can be more easily introduced into the initial facet formation surface. In other words, the occurrence of different polytypes can be suppressed.

In those cases where an adequate number of screw dislocation starting points do not exist in the initial facet formation surface upon cutting of the initial facet formation surface, screw dislocation starting points may be provided artificially in the initial facet formation surface. Examples of methods that can be used for artificially providing screw dislocation starting points include methods of forming a layer having a disturbed crystal structure at the surface by mechanical processing or ion injection or the like. In order to enable growth of an aligned crystal structure on this layer having a disturbed crystal structure, the disturbances must be absorbed in some form. As a result, the screw dislocation starting points become screw dislocations during the crystal growth stage.

Furthermore, the initial facet formation surface is preferably also subjected to a chemical treatment. By subjecting the initial facet formation surface to a chemical treatment, extremely fine steps are formed on the initial facet formation surface. If the initial facet formation surface has steps, then step-flow growth can be performed on a portion of the initial facet formation surface from the initial stage of crystal growth, and the occurrence of different polytypes and the occurrence of defects that accompany the outflow of crystal dislocations can be better suppressed.

(SiC Ingot Production Method)

In a production method for a SiC ingot according to the present invention, a SiC single crystal seed obtained using the method described above is used. The SiC ingot is obtained by epitaxial growth of SiC on the SiC single crystal seed.

Further, when producing the SiC ingot crystal growth is preferably performed so that the isotherm during the growth stage has an inclination angle δ relative to a surface parallel with the initial facet formation surface with an absolute value of less than 2° in any direction. By controlling the isotherm so that the inclination angle δ relative to a surface parallel with the initial facet formation surface has an absolute value of less than 2° in any direction, the facet growth region of the SiC ingot can be restricted to the offset downstream side. This is because the shape of the SiC crystal growth surface is basically the same shape as the isotherm. The SiC crystal growth starts from the SiC single crystal seed. Because the SiC single crystal seed has an initial facet formation surface, the facet at the absolutely initial stage of growth is formed directly on the initial facet formation surface. By controlling the isotherm during crystal growth so that the isotherm is substantially parallel with the initial facet formation surface, the facet obtained at each stage of crystal growth does not deviate significantly from a position directly above the initial facet formation surface. In other words, by controlling the position of the facet during each stage of crystal growth, the position of the facet growth region in the SiC ingot following crystal growth is necessarily restricted to the offset upstream side. If the facet growth region can be restricted to a position near the outer periphery, then a high-quality SiC ingot with fewer defects can be obtained.

Maintaining the isotherm during crystal growth is achieved, for example, by combining two techniques. One is a technique in which by adjusting the positioning of a heater or insulation material around the outside of the crucible, a slightly convex isotherm is produced so as to maintain the facet on the offset upstream end, and the other is a technique in which the crucible is moved during growth to align the isotherm and the height of the growth surface. If an insulation material is provided between a high-temperature region and a low-temperature region, then the region below that position adopts a convex temperature distribution, and the degree of convexness can be adjusted by the positional relationship. The height of the growth surface at any time can be estimated from the results of growth under the same conditions. Accordingly, by performing growth while ensuring that the height of the growth surface adopts the same relative height with respect to the aforementioned insulation material, the angle of the isotherm can be maintained.

The present invention has been described above in detail, but the present invention is not limited to the above embodiments, and various modifications are possible without departing from the fundamental features of the present invention. For example, in the present invention, the description has focused mainly on the (000-1) surface (C-surface) of the {0001} plane, but the present invention is not restricted to this surface, and can be similarly applied to the (0001) surface (Si surface).

Crystallographically, (0001) and {0001} indicate crystal planes. The differences between these two is that because the {0001} plane includes surfaces having equivalent symmetry, it includes both the (0001) surface and the (000-1) surface. On the other hand, <0001> indicates a crystal orientation.

EXAMPLES

Examples of the present invention are described below. The present invention is not limited solely to the following examples.

Example 1

A SiC single crystal seed was cut from a SiC single crystal, obtained using the RAF method, so as to obtain a main surface having an offset angle of 4° relative to the {0001} plane. Two corners on the offset upstream side of the cut SiC single crystal seed were then cut away to produce two sub-growth surfaces. The apex formed by these two sub-growth surfaces and the main surface was then cut away to prepare a SiC single crystal seed having an initial facet formation surface such as that illustrated in FIG. 4(a). At this point, the surface area of the initial facet formation surface was 25 mm$^2$, and the inclination angle θ relative to the {0001} plane was 0°. The screw dislocation density on the initial facet formation surface was 16/cm$^2$.

By subjecting the SiC single crystal seed obtained in this manner to SiC epitaxial growth using the sublimation method, a SiC ingot was produced. The results revealed that no occurrence of different polytypes could be confirmed in the SiC ingot of Example 1.

Example 2

A SiC ingot was prepared using the same procedure as Example 1. However, Example 2 differed from Example 1 in that the screw dislocation density on the formed initial facet formation surface was 36/cm$^2$.

In a similar manner to Example 1, no occurrence of different polytypes could be confirmed in the SiC ingot of Example 2.

Example 3

A SiC ingot was prepared using the same procedure as Example 1. However, Example 3 differed from Example 1 in that the screw dislocation density on the formed initial facet formation surface was 60/cm$^2$.

In a similar manner to Example 1, no occurrence of different polytypes could be confirmed in the SiC ingot of Example 3.

Comparative Example 1

A SiC ingot was prepared using the same procedure as Example 1. However, no screw dislocation starting points existed on the initial facet formation surface. In other words, the Comparative Example 1 differed from Example 1 in that the screw dislocation starting point density was 0/cm$^2$.

In the SiC ingot of Comparative Example 1, the occurrence of different polytypes was confirmed.

Comparative Example 2

A SiC single crystal seed was cut from a SiC single crystal, obtained using the RAF method, so as to obtain a main surface having an offset angle of 4° relative to the {0001} plane. Two corners on the offset upstream side of the cut SiC single crystal seed were then cut away to produce two sub-growth surfaces. The apex formed by these two sub-growth surfaces and the main surface was not cut, thus forming a SiC single crystal seed having a state illustrated on the left-hand side of FIG. 7(a). At this point, the screw dislocation density in the vicinity of the apex formed by the two sub-growth surfaces and the main surface was about 1,000/cm$^2$.

By subjecting the SiC single crystal seed obtained in this manner to SiC epitaxial growth using the sublimation method, a SiC ingot was produced. The results revealed that different polytypes occurred with a probability of 50% in the SiC ingot of Comparative Example 2.

TABLE 1

|  | Comparative Example 1 | Comparative Example 2 | Example 1 | Example 2 | Example 3 |
| --- | --- | --- | --- | --- | --- |
| Screw dislocation density in facet (/cm$^2$) | 0 | 1.1 × 10$^3$ | 16 | 36 | 60 |

TABLE 1-continued

|  | Comparative Example 1 | Comparative Example 2 | Example 1 | Example 2 | Example 3 |
|---|---|---|---|---|---|
| Probability of occurrence of different polytypes (%) | 100 | 50 | 0 | 0 | 0 |

DESCRIPTION OF THE REFERENCE SIGNS

10: Main surface
20: Sub-growth surface
21: Initial facet formation surface
30: Screw dislocation starting point
100: SiC single crystal seed
200: SiC ingot
210: Facet growth region
210a: Growth interface
210b: Outermost surface of facet growth region
220: Step-flow growth region
220a: Growth interface
230: Screw dislocation
240: Cut surface of facet growth region

The invention claimed is:

1. A SiC single crystal seed having a main surface with an offset angle of at least 2° but not more than 20° relative to a {0001} plane, and at least one sub-growth surface, wherein
the sub-growth surface includes an initial facet formation surface that is on an offset upstream side of the main surface and has an inclination angle θ relative to the {0001} plane with an absolute value of less than 2° in any direction, and
the initial facet formation surface has a screw dislocation starting point,
wherein a number of the sub-growth surfaces, including the initial facet formation surface, is at least three, and each edge of the initial facet formation surface has a common edge with the main surface or a sub-growth surface.

2. The SiC single crystal seed according to claim 1, wherein the initial facet formation surface is a top surface formed by cutting an apex formed by the main surface and at least two of the sub-growth surfaces.

3. The SiC single crystal seed according to claim 1, wherein an effective screw dislocation starting point density of the initial facet formation surface is at least 16/cm² but not more than 1,000/cm².

4. The SiC single crystal seed according to claim 1, wherein the screw dislocation starting point of the initial facet formation surface is a screw dislocation.

5. The SiC single crystal seed according to claim 4, wherein the screw dislocation density of the initial facet formation surface is at least 16/cm² but not more than 1,000/cm².

6. The SiC single crystal seed according to claim 1, wherein a screw dislocation density of a surface positioned offset downstream from the initial facet formation surface is not more than 15/cm².

7. The SiC single crystal seed according to claim 1, wherein a surface area of the initial facet formation surface is at least 1.0 mm².

8. The SiC single crystal seed according to claim 1, wherein if an effective screw dislocation starting point density of the initial facet formation surface is termed d (/cm²), then a surface area A (cm²) of the initial facet formation surface satisfies $0.5 \leq 1-(1-A)^{d-1}(1-A+dA)$.

9. The SiC single crystal seed according to claim 1, wherein a maximum diameter $D_{F1}$ of a circumscribed circle and a maximum diameter $D_{F2}$ of an inscribed circle of the initial facet formation surface satisfy a relationship $D_{F1}/D_{F2} < 4$.

10. The SiC single crystal seed according to claim 1, wherein at least one edge where the main surface contacts the initial facet formation surface is substantially perpendicular to an offset direction.

11. The SiC single crystal seed according to claim 1, wherein if a diameter of a circumscribed circle of the single crystal seed is termed Ds, then the initial facet formation surface exists in a position that is separated from a center of the overall single crystal seed by at least $D_S/4$.

12. A SiC ingot grown from the SiC single crystal seed according to claim 1, wherein
the SiC ingot has a facet growth region across an entire region in a SiC growth direction from the facet formation surface of the SiC single crystal seed.

13. The SiC ingot according to claim 12, wherein if an effective screw dislocation starting point density of the initial facet formation surface is termed d (/cm²), then a surface area $A_f$ (cm²) of a cut surface obtained by cutting the facet growth region through a surface orthogonal to a growth direction satisfies $0.5 \leq 1-(1-A_f)^{d-1}(1-A_f+dA_f)$.

14. The SiC ingot according to claim 12, wherein a screw dislocation density of a cut surface obtained by cutting the facet growth region through a surface orthogonal to a growth direction is at least 16/cm² but not more than 1,000/cm².

15. The SiC ingot according to claim 12, wherein when viewed in plan view from a direction orthogonal to a c-face facet, the initial facet formation surface of the SiC single crystal seed and the c-face facet of an outermost surface of the facet growth region overlap at least partially.

16. A production method for a SiC single crystal seed in which an initial facet formation surface includes a screw dislocation starting point,
the method having a step of cutting a portion of a SiC single crystal, and forming a main surface having an offset angle of at least 2° but not more than 20° relative to a {0001} plane, and at least one sub-growth surface including an initial facet formation surface that is on an offset upstream side of the main surface and has an inclination angle θ relative to the {0001} plane with an absolute value of less than 2° in any direction,
wherein a surface area A (cm²) of the facet formation surface is set so as to satisfy $X=1-(1-A)^{d-1}(1-A+dA) > 0$, wherein X is a probability that at least two screw dislocations are included in the initial facet formation surface, and d represents an effective screw dislocation starting point density of the initial facet formation surface.

17. The production method for a SiC single crystal seed according to claim 16, wherein the initial facet formation surface is also subjected to a chemical treatment.

18. The production method for a SiC single crystal seed according to claim 16, wherein the surface area A is determined so that the probability X that at least two screw dislocations are included is 0.5 or higher.

19. A production method for a SiC ingot, the method comprising the step of growing crystal from the SiC single crystal seed according to claim 1, in such a way that an inclination angle δ between an isotherm during a growth stage and a surface parallel with the initial facet formation surface is less than 2° with an absolute value in any direction in a facet growth region in which the SiC single crystal seed undergoes crystal growth in a <0001> direction from the initial facet formation surface.

\* \* \* \* \*